(12) United States Patent
Ueki et al.

(10) Patent No.: US 7,545,040 B2
(45) Date of Patent: Jun. 9, 2009

(54) COPPER ALLOY FOR WIRING, SEMICONDUCTOR DEVICE, METHOD FOR FORMING WIRING AND METHOD FOR MANUFACTURING SEMICONDUCTOR DEVICE

(75) Inventors: Makoto Ueki, Tokyo (JP); Masayuki Hiroi, Tokyo (JP); Nobuyuki Ikarashi, Tokyo (JP); Yoshihiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/538,306

(22) PCT Filed: Sep. 22, 2003

(86) PCT No.: PCT/JP03/12080

§ 371 (c)(1),
(2), (4) Date: Jun. 9, 2005

(87) PCT Pub. No.: WO2004/053971

PCT Pub. Date: Jun. 24, 2004

(65) Prior Publication Data

US 2006/0113685 A1      Jun. 1, 2006

(30) Foreign Application Priority Data

Dec. 9, 2002   (JP)   .............................. 2002-356291

(51) Int. Cl.
    *H01L 23/48*   (2006.01)
(52) U.S. Cl. .................. 257/751; 257/765; 257/688
(58) Field of Classification Search ................ 257/785, 257/774, 751; 438/687
    See application file for complete search history.

(56) References Cited

U.S. PATENT DOCUMENTS 5,552,341 A * 9/1996 Lee ............................. 438/643

(Continued)

FOREIGN PATENT DOCUMENTS

EP       0751567 A2      1/1997

(Continued)

OTHER PUBLICATIONS

E. T. Ogawa et al., "Stress-Induced Voiding Under Vias Connected To Wide Cu Metal Leads", Proceedings of IEEE International Reliability Physics Symposium 2002, USA, The Electron Device Society and The Reliability Society of the Institute of Electrical and Electronics Engineers, Inc, Apr. 7, 2002, pp. 312-321.

*Primary Examiner*—Thao X Le
*Assistant Examiner*—Ajay K Arora
(74) *Attorney, Agent, or Firm*—Sughrue Mion, PLLC

(57) ABSTRACT

A wiring metal contains a polycrystal of copper (Cu) as a primary element and an additional element other than Cu, and concentration of the additional element is, at crystal grain boundaries composing the Cu polycrystal and in vicinities of the crystal grain boundaries, higher than that of the inside of the crystal grains. The additional element is preferably at least one element selected from a group consisting of Ti, Zr, Hf, Cr, Co, Al, Sn, Ni, Mg, and Ag. This Cu wiring is formed by forming a Cu polycrystalline film, forming an additional element layer on this Cu film, and diffusing this additional element from the additional element layer into the Cu film. This copper alloy for wiring is preferred as metal wiring formed for a semiconductor device.

8 Claims, 15 Drawing Sheets

U.S. PATENT DOCUMENTS

| | | | |
|---|---|---|---|
| 6,228,759 B1 * | 5/2001 | Wang et al. | 438/625 |
| 2003/0116845 A1 * | 6/2003 | Bojkov et al. | 257/738 |
| 2003/0155655 A1 * | 8/2003 | Fitzsimmons et al. | 257/774 |
| 2003/0217462 A1 * | 11/2003 | Wang et al. | 29/846 |
| 2004/0188850 A1 * | 9/2004 | Lee et al. | 257/774 |

FOREIGN PATENT DOCUMENTS

| | | |
|---|---|---|
| JP | 02-165632 A | 6/1990 |
| JP | 09-020942 A | 1/1997 |
| JP | 09-064033 A | 3/1997 |
| JP | 11-102909 A | 4/1999 |
| JP | 2000-150522 A | 5/2000 |
| JP | 2000-208517 A | 7/2000 |
| JP | 2001-298084 A | 10/2001 |

* cited by examiner (a) NO Ti FORMING (b) Ti FORMING

COPPER ALLOY FOR WIRING, SEMICONDUCTOR DEVICE, METHOD FOR FORMING WIRING AND METHOD FOR MANUFACTURING SEMICONDUCTOR DEVICE

TECHNICAL FIELD

The present invention relates to a copper alloy for wiring, a semiconductor device using said wiring, a method for forming the wiring, and a method for manufacturing the semiconductor device, and in particular, to a copper alloy for wiring with an improved wiring reliability, a semiconductor device using wiring formed of said copper alloy, a method for forming the wiring, and a method for manufacturing the semiconductor device.

BACKGROUND ART

Conventionally, aluminum (Ai) or Al alloy has been widely used for a wiring material of semiconductor devices. However, with the progression in miniaturization and high speed operation of semiconductor devices, copper (Cu) has been used as a wiring material for an improvement in transmission delay of wiring, because copper has a lower resistivity. In addition, Cu has a melting point of 1083° C., which is higher than the melting point of Al of 660° C., and is generally considered to be high in electromigration (EM) resistance and also excellent in the aspect of reliability.

When wiring is formed of Cu, since processing by dry etching of Cu is difficult, a damascene method has been generally used for forming Cu wiring. The damascene method is a method for forming Cu wiring by forming wiring grooves in an insulating film formed on a semiconductor substrate, forming a Cu film so as to fill up the grooves, and polishing the Cu film until the insulating film is exposed so as to remove an excessive Cu film on the insulating film excluding that in the wiring grooves, whereby Cu wiring is provided in a buried manner into wiring grooves.

In addition, for using Cu as a wiring material, it is necessary to provide a barrier metal film around Cu in order to prevent Cu from diffusing into an insulating film and Cu corrosion. In the following, description will be given of a currently generally used manufacturing method of a semiconductor device having Cu wiring while referring to the drawings.

FIGS. 9(a) through (g) are sectional views showing a conventional manufacturing method for a semiconductor device. FIG. 9(a) shows lower-layer wiring on which upper-layer wiring is to be formed. This lower-layer wiring is composed of an insulating film 1a, a barrier metal film 3a, Cu 4a, and a barrier insulating film 8a. This lower-layer wiring part is also formed by use of processes similar to those of the upper-layer wiring.

As shown in FIG. 9(b), an insulating film 1b is formed on this lower-layer wiring, and then as shown in FIG. 9(c), in the insulating film, wiring grooves and wiring holes are formed by lithography and anisotropic etching. Thereafter, as shown in FIG. 9(d), a barrier metal film 3b, which is a conductive film, is formed on the internal surfaces of the wiring grooves and wiring holes, and as shown in FIG. 9(e), in a manner filling up the wiring grooves and wiring holes, a Cu film 4b is formed on the insulating film 1b.

Next, as shown in FIG. 9(f), by CMP (Chemical Mechanical Polishing), an excessive Cu film 4b and barrier metal film 3b excluding the parts buried in the wiring grooves and wiring holes are removed. Then, as shown in FIG. 9(g), a barrier insulating film 8b, which is an isolator, is formed on the entire surface. In such a manner, a Cu wiring structure whose lower surface and side surfaces have been covered with the barrier metal film 3b, which is a conductor, and whose upper surface has been covered with the barrier insulating film 8b, which is an insulator, is formed.

However, in Japanese Published Unexamined Patent Application No. 2001-298084, there is a description that when a wiring (wiring groove) width is seven times or more a via (also referred to as a wiring hole or a contact hole) diameter, a disconnection owing to a void (cavity) which is generated under and inside the via, and the disconnection occurs at the most accelerated rate at around 150° C.

Similarly, in the following publication, there is a description that, when lower-layer wiring to which vias are connected has a wide width, there is voiding on the surface of lower-layer wiring to be a connecting portion, and the disconnection easily occurs during isothermal storage at 190° C.

"Stress-Induced Voiding Under Vias Connected TO Wide Cu Metal Leads" (Proceeding of IEEE International Reliability Physics Symposium 2002, USA, The Electron Device Society and The Reliability Society of the Institute of Electrical and Electronics Engineers, Inc, Published on Apr. 7, 2002, p 312-321)

Next, description will be given of a method for manufacturing a conventional semiconductor device shown in FIGS. 10(a) through (h). This method is a method for forming copper alloy wiring when an alloy sputter target disclosed in Japanese Published Unexamined Patent Application No. 2000-150522 and the like is used. FIG. 10(a) shows lower-layer wiring on which an upper layer is to be formed. This lower-layer wiring part is also formed by processes similar to those of the upper layer shown in the following.

First, as shown in FIG. 10(b), an insulating film 1b is formed on this lower-layer wiring. Then, as shown in FIG. 10(c), in the insulating film 1b, wiring grooves and wiring holes are formed by lithography and anisotropic etching. Then, as shown in FIG. 10(d), a barrier metal film 3b, as a conductive film is formed on the entire surface including the internal surfaces of the wiring grooves and wiring holes. Furthermore, an alloy seed layer 10b to be electrodes when filling up the wiring grooves and wiring holes is formed on the barrier metal 3b by a sputtering method using a Cu alloy target. Then, as shown in FIG. 10(e), by a plating method or a CVD method (Chemical Vapor Deposition Method), a Cu film 4b is formed on the entire surface so as to fill up the wiring grooves and wiring holes.

Next, as shown in FIG. 10(f), an additional element in the alloy seed layer 10b is diffused into the Cu film 4b by heat treatment, whereby the Cu film 4b is alloyed to form a Cu alloy film 6c.

Next, as shown in FIG. 10(g), an excessive Cu alloy film 6c and barrier metal film 3b on the surface of the insulating film 1b excluding the parts buried in the wiring grooves and wiring holes are removed by CMP, and as shown in FIG. 10(h), a barrier insulating film 8b, which is an insulator, is formed on the entire surface. In such a manner, a Cu wiring structure whose lower surface and side surfaces have been covered with the barrier metal film 3b, which is a conductor, and whose upper surface has been covered with the barrier insulating film 8b, which is an insulator, is formed.

In addition, in Japanese Published Unexamined Patent Application No. 2000-208517, when using metal wiring of a semiconductor device, a technique using a CuSn alloy seed layer has been disclosed.

With regard to reliability of Cu wiring formed as shown in FIG. 9(a) through (g), in addition to EM resistance, void formation owing to a stress induced migration (SM) has become a crucial problem. A tensile stress caused by a difference in thermal expansion coefficients between the Cu and insulating film to be applied to a Cu wiring portion serves as a driving force of the void formation.

Correspondingly, as described in the above-described Japanese Published Unexamined Patent Application No. 2001-298084 and the above-described publication, a disconnection owing to a void formation occurs. Such a failure caused by stress is expected to become more prominent when the via diameter is further reduced by miniaturization of the element.

In addition, as countermeasures against EM and SM, priorly, alloying of Cu wiring has been investigated in numerous cases. In alloying, by changing Cu composition, migration resistance of Cu can be improved.

However, as in the above-described Japanese Published Unexamined Patent Application No. 2000-208517, Cu alloy wiring formed by the method shown in FIG. 10(a) through (h) has the following problems. Namely, when an alloy seed layer 10b was formed, by diffusing an additional element in the alloy seed layer 10b into the Cu film 4b by heat treatment, a Cu alloy is formed. On the other hand, the additional element in the alloy seed layer 10b is diffused into the Cu film 4b by heat treatment, and is partly precipitated on crystal grain boundaries 7b of the Cu alloy film 6c, however, the additional element mostly remains in crystal grains of the Cu alloy film 6c. Electron scattering occurs under the influence of this additional element remaining in crystal grains of the Cu alloy film 6c.

In addition, under the influence of grain boundary scattering of electrons as a result of a reduction in the size of Cu crystal grains by heat treatment, resistivity of the formed Cu alloy wiring rises.

Furthermore, although it is ideal that the additional element in the alloy seed layer 10b uniformly diffuses into the Cu film 4b, if the diffusion speed of the additional element into the Cu film 4b is slow, the additional element remains in the alloy seed layer 10b in large quantity. At this time, under the influence of the additional element remaining in the alloy seed layer 10b in large quantity, resistivity of the Cu wiring rises, and also concentration profiles of the additional element in the bulk Cu film 6c can change as a result of heat treatment to form wiring of a more upper layer, therefore, instability occurs with respect to a heat cycle at the time of multi-layer formation.

Furthermore, under the influence of the additional element in the alloy seed layer 10b, growth of the crystal grains of the Cu film 6c is suppressed. Particularly, in such a case where the additional element is precipitated on Cu crystal grain boundaries, pinning of the grain boundaries occurs under the influence of the precipitated additional element, and growth of the Cu crystal grains in heat treatment is suppressed. As a result, since the diameter of Cu crystal grains is reduced, this raises resistivity of the Cu wiring and also exerts an influence on a decline in wiring reliability caused by EM and SM and the like.

In addition, when the Cu alloy seed layer 10b is formed by sputtering, since Cu filling capability by sputtering is different depending on the width of the wiring groove and wiring hole, inconvenience occurs. Namely, with narrow wiring, since sputter filling capability is deteriorated, the alloy seed layer 10b deposited on the bottom of the wiring groove has a thin film thickness. Therefore, concentration of the additional element in the Cu wire in a narrow-width wiring groove becomes relatively small compared to that of a wide-width wiring groove. As a result, the Cu wires in the narrow-width wiring groove has a low resistivity compared to that of a wide-width wiring groove. As such, when the alloy seed layer 10b is formed by a sputtering method, since concentration of the additional element is different depending on the width of the wiring groove, resistivity of the Cu wiring varies depending on the width of the wiring groove.

Furthermore, in the above-described Japanese Published Unexamined Patent Application 2000-208517, it has been reported that adhesion between the barrier metal film and the alloy seed layer is deteriorated when a CuSn alloy seed layer is used. As such, securing adhesion between the barrier metal layer 3b and alloy seed layer 10 has also become a crucial problem.

An object of the present invention is to provide a highly reliable copper alloy for wiring for which wiring delay has been improved, which is high in performance, and which is excellent in SM resistance and EM resistance, a semiconductor device using the same wiring, a method for forming the wiring, and a method for manufacturing the semiconductor device.

DISCLOSURE OF THE INVENTION

A copper alloy for wiring according to the present invention is composed of a polycrystalline copper alloy consisting of Cu (copper) as a primarily element and an or a primarily of additional element(s), wherein the concentration of said additional element is, at grain boundaries of crystal grains of said polycrystalline copper alloy and in vicinities of grain boundaries, higher than that of the inside of the crystal grains.

According to this invention, by introducing an additional element into Cu crystal grain boundaries and vicinities of crystal grains which serve as diffusion paths of SM or EM in wiring at a high concentration, Cu migration along the Cu crystal grain boundaries can be suppressed, whereby reliability of a metal for wiring can be improved. Furthermore, by this invention, a metal for wiring for which wiring delay has been suppressed and which is high in performance can be provided.

In this copper alloy for wiring, it is preferable that the additional element is at least one element selected from a group consisting of Ti (titanium), Zr (zirconium), Hf (hafnium), Cr (chromium), Co (cobalt), Al (aluminum), Sn (tin), Ni (nickel), Mg (magnesium), and Ag (silver).

The additional element is an element whose solid solubility limit in a Cu film is 1 atomic percent or less and whose diffusion coefficient at Cu crystal grain boundaries is great, and by adding this additional element to the inside of the Cu film, the additional element can be introduced into crystal grain boundaries of the Cu film and vicinities of crystal grain boundaries at a high concentration. Therefore, Cu migration along the Cu crystal grain boundaries can be suppressed, whereby reliability of wiring can be improved.

In the copper alloy for wiring of the present invention, for example, at the crystal grain boundaries and/or in the vicinities of grain boundaries, intermetallic compounds of Cu with at least one element selected from a group consisting of Ti, Zr, Hf, Cr, Co, Al, Sn, Ni, Mg, and Ag are formed.

According to this invention, by forming stable intermetallic compounds at Cu crystal grain boundaries and in vicinities of crystal grain boundaries (frontmost surfaces of Cu crystal grains) which serve as diffusion paths of SM or EM, Cu migration along the Cu crystal grain boundaries can be suppressed, whereby reliability of wiring can be improved.

In addition, in the copper alloy for wiring of the present invention, for example, at the crystal grain boundaries and/or in the vicinities of grain boundaries, oxides of at least one element selected from a group consisting of Ti, Zr, Hf, Cr, Co, Al, Sn, Ni, Mg, and Ag are formed.

According to this invention, by forming stable metal oxides at Cu crystal grain boundaries and in vicinities of crystal grain boundaries (frontmost surfaces of Cu crystal grains) which serve as diffusion paths of SM or EM, Cu migration along the Cu crystal grain boundaries can be suppressed, whereby reliability of wiring can be improved.

In the copper alloy for wiring of the present invention, it is preferable that concentration of the additional element of the inside of the crystal grains is 0.1 atomic percent or less.

According to this invention, by providing a construction wherein an additional element is introduced into Cu crystal grain boundaries and vicinities of crystal grain boundaries which serve as diffusion paths of SM or EM at a high concentration, while inside the crystal grains, an extremely slight amount of the additional element of 0.1 atomic percent or less is contained, Cu migration along Cu crystal grain boundaries can be suppressed, whereby reliability of wiring can be improved.

A semiconductor device according to the present invention is characterized in that, on a substrate on which a semiconductor element has been formed, metal wiring composed of the copper alloy for wiring as set forth in any one of Claims 1 through 5 of the present application is formed.

According to this invention, by introducing an additional element into Cu crystal grain boundaries and vicinities of crystal grain boundaries which serve as diffusion paths of SM or EM in metal wiring of a semiconductor device at a high concentration, Cu migration along Cu crystal grain boundaries can be suppressed, whereby reliability of metal wiring can be improved. Furthermore, by this invention, a semiconductor device having metal wiring for which wiring delay has been suppressed and which is high in performance can be provided.

A forming method for wiring according to the present invention comprises the steps of: forming a polycrystalline Cu film; forming a layer formed of an additional element which is to be added into the Cu film on the polycrystalline Cu film; and diffusing the additional element from the additional element layer into the polycrystalline Cu film.

According to this invention, since crystal grains of a Cu film are grown in a polycrystalline Cu film forming step and an additional element is introduced into this polycrystalline Cu film, no such suppression of Cu crystal grain growth owing to an influence of an additional element in heat treatment as observed in a case where a Cu alloy seed layer is formed by use of a sputter target in which an additional element has been mixed at a few percent occurs. In addition, since the additional element hardly exists inside bulk crystal grains, electron scattering in the bulk crystal grains by the additional element is suppressed, and resistance of the copper alloy for wiring can be lowered. As a result, highly reliable wiring for which wiring delay has been suppressed, which is high in performance, and which is excellent in SM resistance and EM resistance can be obtained.

In the forming method for wiring, a heating step of heating a substrate on which the polycrystalline Cu film has been formed, a step of forming the additional element layer, and a step of diffusing the additional element can be simultaneously performed.

According to this invention, in addition to the effects as mentioned above, by simultaneously performing these respective steps, the wiring forming steps can be simplified by omitting several steps.

The additional element is at least one element selected from a group consisting of Ti, Zr, Hf, Cr, Co, Al, Sn, Ni, Mg, and Ag.

Since these additional elements are elements whose solid solubility limits are 1 atomic percent or less and whose diffusion coefficients at Cu crystal grain boundaries are great, an additional element can be introduced into Cu crystal grain boundaries and vicinities of crystal grain boundaries at a high concentration. Therefore, Cu migration along Cu crystal grain boundaries can be suppressed, whereby reliability of wiring can be improved.

A method for manufacturing a semiconductor device according to the present invention comprises the steps of: forming a polycrystalline Cu film on a substrate on which a semiconductor element has been formed; forming a layer composed of an additional element on the polycrystalline Cu film; and diffusing the additional element from the additional element layer into the polycrystalline Cu film.

According to this invention, since Cu crystal grains are grown in a polycrystalline Cu film forming step and an additional element is introduced into this polycrystalline Cu film, no such suppression of Cu crystal grain growth owing to an influence of an additional element in heat treatment as observed in a case where a Cu alloy seed layer is formed by use of a sputter target in which an additional element has been mixed at a few percent occurs. In addition, since the additional element hardly exists inside bulk Cu crystal grains, electron scattering in the bulk crystal grains by the additional element is suppressed, and resistance of the Cu wiring in a semiconductor device can be lowered. As a result, a highly reliable metal wiring in which wiring delay has been suppressed, which is high in performance, and which is excellent in SM resistance and EM resistance can be obtained.

Another method for manufacturing a semiconductor device according to the present invention comprises the steps of: forming an insulating film on a substrate on which a semiconductor element has been formed; forming concavities for wiring composed of at least either grooves or holes in the insulating film; forming a Cu film on the insulating film so as to fill up the concavities for wiring; removing an excessive Cu film on the insulating film excluding parts buried in the concavities for wiring by chemical mechanical polishing; forming a layer composed of an additional element on the Cu film; diffusing the additional element from the additional element layer into the Cu film; and removing an excessive additional element layer.

According to this invention, Cu crystal grains are grown in a polycrystalline Cu film forming step, and an additional element is introduced into this polycrystalline Cu film. Therefore, no such suppression of Cu crystal grain growth owing to an influence of an additional element by heat treatment as observed in a case where a Cu alloy seed layer is formed by use of a sputter target in which an additional element has been mixed at a few percent occurs. In addition, since the additional element hardly exists inside bulk Cu crystal grains, electron scattering in the bulk Cu crystal grains by the additional element is suppressed, and resistance of the Cu wiring in a semiconductor device can be lowered. Furthermore, according to the present invention, since an additional element is introduced (diffused into Cu) into a Cu film from an additional element layer of an upper layer after a Cu film is buried in the concavities for wiring, such a difference in concentration of the additional element owing to a difference in Cu filling capability between respective grooves and respective holes hardly occurs, said difference has been observed in a case where a Cu alloy seed layer is formed by use of a sputter target, and the wiring grooves and wiring holes are filled with Cu. As a result, unevenness in resistivity of Cu wiring depending on the width of wiring grooves is eliminated.

Still another method for manufacturing a semiconductor device according to the present invention comprises the steps of: forming an insulating film on a substrate on which a semiconductor element has been formed; forming concavities for wiring composed of at least either grooves or holes in the insulating film; forming a barrier metal to prevent Cu from diffusing on the insulating film including inner surfaces of the concavities for wiring; forming a Cu film on the insulating film so as to fill up the same in the concavities for wiring; removing a Cu film and a barrier metal film excluding parts buried in the concavities for wiring by chemical mechanical polishing; forming a layer composed of an additional element on the Cu film in the concavities for wiring; diffusing the additional element from the additional element layer into the Cu film; and removing an excessive additional element layer.

According to this invention, since Cu crystal grains are grown in a polycrystalline Cu film forming step, and an additional element is introduced into this polycrystalline Cu film, no suppression of Cu crystal grain growth owing to an influence of an additional element in heat treatment occurs. In addition, since the additional element hardly exists inside bulk Cu crystal grains, electron scattering in the bulk Cu crystal grains by the additional element is suppressed, and resistance of the Cu wiring in a semiconductor device can be lowered. In addition, since an additional element is introduced into a Cu film from an additional element layer of an upper layer after a Cu film is buried, a difference in concentration of the additional element in Cu wiring becomes unlikely to occur, thus unevenness in resistivity of Cu wiring depending on the width of wiring grooves is eliminated. Furthermore, since a barrier metal is provided between the Cu and insulating film, diffusion of Cu into the insulating film and corrosion of Cu can be prevented.

In the present invention, before a step of removing the excessive Cu film, a step of forming the additional element layer, a step of diffusing the additional element, and a step of removing the excessive additional element layer can be performed.

According to this invention, as a result of a formation of stable intermetallic compounds of Cu and an additional element at Cu crystal grain boundaries and in vicinities of crystal grain boundaries, EM resistance and SM resistance are improved, whereby reliability of wiring of an semiconductor device is improved.

In addition, in the present invention, after a step of removing the excessive Cu film, a step of forming the additional element layer, a step of diffusing the additional element, and a step of removing the excessive additional element layer can be performed.

According to the present invention, by performing a step of forming the additional element layer, a step of diffusing the additional element, and a step of removing the excessive additional element layer after a step of removing the excessive Cu film, stable intermetallic compounds of Cu and an additional element are formed on the surfaces of Cu crystal grains which are in contact with a layer formed on the Cu film, which is a metal for wiring. As a result, adhesion between the Cu of a metal for wiring and upper layer is improved, whereby reliability of wiring of an semiconductor device is improved.

In the method for manufacturing a semiconductor device of the present invention, a step of heating the substrate, a step of forming the additional element layer, and a step of diffusing the additional element can be simultaneously performed.

According to this invention, in addition to the effects as mentioned above, by simultaneously performing these respective steps, manufacturing of a semiconductor device can be simplified by omitting the severed steps.

The additional element is at least one element selected from a group consisting of Ti, Zr, Hf, Cr, Co, Al, Sn, Ni, Mg, and Ag.

According to this invention, since the additional element is an element whose solid solubility limit in Cu is 1 atomic percent or less and whose diffusion coefficient at Cu crystal grain boundaries is large, by adding this additional element to a Cu film, the additional element can be introduced into Cu crystal grain boundaries and vicinities of crystal grain boundaries at a high concentration. Therefore, Cu migration along Cu crystal grain boundaries can be suppressed, whereby reliability of metal wiring of a semiconductor device can be improved.

BEST MODE FOR CARRYING OUT THE INVENTION

Next, embodiments of the present invention will be described in detail with reference to the drawings.

First Embodiment

A Cu wiring structure of a semiconductor device according to a first embodiment of the present invention will be described with reference to FIG. 1.

Figure 1:
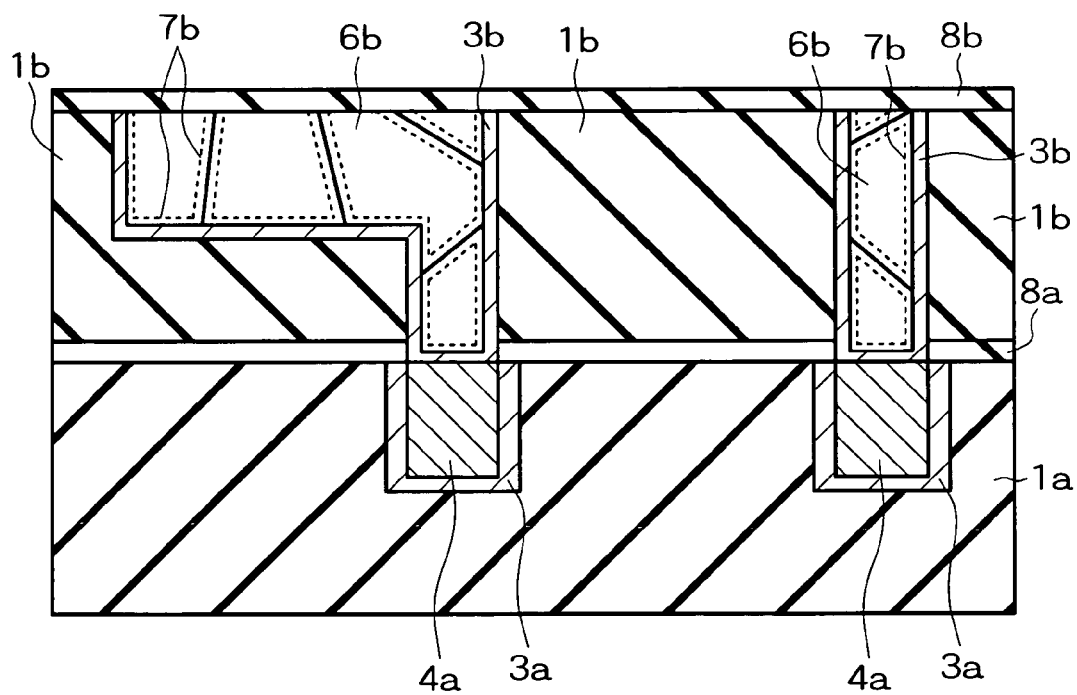
FIG. 1 is a sectional view showing a semiconductor device according to a first embodiment of the present invention.

A Cu wiring structure of a semiconductor device shown in FIG. 1 has a lower-layer wiring composed of an insulating film 1a, a barrier metal film 3a, Cu 4a, and a barrier insulating film 8a, and an upper-layer wiring composed of an insulating film 1b, a barrier metal film 3b, Cu crystal grains 6b, Cu grain boundaries and vicinities thereof 7b, and a barrier insulating film 8b. Here, the Cu 4a of the lower-layer wiring is constructed similarly to the Cu crystal grains 6b and Cu grain boundaries and vicinities thereof 7b of the upper wiring.

And, the feature of the first embodiment is a structure wherein at least any of a large quantity of an additional element, intermetallic compounds of Cu and an additional element, and oxides of an additional element have been precipitated on boundaries of Cu crystal grains 6b and vicinities thereof and interfaces between the Cu grain grains 6b and the barrier metal film 3b and vicinities thereof (shown as reference numeral 7b).

Cu metal wiring is made of a Cu polycrystal doped with a metallic element other than Cu. The Cu crystal grains 6b composing the polycrystal are Cu crystal grains whose crystal grain growth is not restricted and which has an average and appropriate size on the order of 1 μm to 10 μm.

And, the Cu crystal grain boundaries 7b and the interfaces 7b between the Cu crystal grains 6b and the barrier metal layer 3b have a structure wherein the additional element or compounds containing the additional element (intermetallic compounds with Cu, oxides or the like) have been precipitated. In addition, there is a structure wherein, intermetallic compounds of the additional element with Cu or the like have been formed, in addition to the Cu crystal grain boundaries and the like, in the vicinities 7b of Cu crystal grains. Here, the vicinities Cu crystal grain boundaries herein mentioned indicate positions on the order of 10 nm inward from the crystal grain surfaces of the Cu crystal grains 6b.

Although concentration of the additional element at the grain boundaries of the Cu crystal grains 6b and vicinities 7b of grain boundaries is not particularly limited, an additional element of a larger quantity than that of at least the inside of the Cu crystal grains 6b exists at the grain boundaries of the Cu crystal grains 6b and vicinities 7b of grain boundaries. Concretely, concentration of the additional element at the grain boundaries of the Cu crystal grains 6b and vicinities 7b of grain boundaries is on the order of 2 to 1000 times the additional element concentration at the inside of the Cu crystal grains 6b, and preferably, on the order of 10 to 100 times.

It is possible to measure additional element concentration at the Cu crystal grain boundaries and vicinities thereof 7b by, for example, X-ray spectroscopy. This measuring method is detectable when the additional element concentration at Cu crystal grains and vicinities thereof 7b is 0.1 atomic percent (hereinafter, atomic percent is referred to as atomic %) or more.

On the other hand, inside the Cu crystal grains 6b, in other words, in bulk Cu 6b, only an additional element of 0.1 atomic % or less exists, which is a nearly pure Cu condition. Here, the inside of the Cu crystal grains herein mentioned means a part of Cu crystal grains excluding the aforementioned vicinities of Cu crystal grain boundaries.

It is possible to measure additional element concentration at the inside of the Cu crystal grains 6b by, for example, SIMS (Secondary Ion Mass Spectroscopy), X-ray spectroscopy or the like. SIMS can be used when measuring Cu crystal grains have a diameter greater than a beam diameter (normally, a few tens of micrometers) used in SIMS. When the Cu crystal grain diameter is smaller than the same, by determining an average concentration of the additional element at an area including grain boundaries and the inside of the Cu crystal grains by SIMS and by determining an additional element concentration at the aforementioned Cu crystal grain boundaries and vicinities 7b of grain boundaries, an additional element concentration at the inside of the Cu crystal grains can be estimated. In addition, by X-ray spectroscopy from the Cu crystal surface, additional element concentration can be measured if the atomic percent is 1 or more. Here, detection sensitivity by X-ray spectroscopy is on the order of 0.1 atomic percent.

As such, at positions of the grain boundaries of Cu crystal grains and vicinities 7b of grain boundaries, concentration (content) of the additional element is provided higher than that of the inside of the Cu crystal grains 6b.

In addition, as the additional element, an element whose solid solubility limit in Cu is 1 atomic % or less and whose diffusion coefficient at Cu crystal grain boundaries is great can be used. A diffusion coefficient of the additional element at Cu bulk (inside of the Cu crystal grains) does not necessarily have to be great. As the additional element, in particular, titanium (Ti), zirconium (Zr), hafnium (Hf), chromium (Cr), and cobalt (Co) are preferably used. As the additional element, in addition, aluminum (Al), tin (Sn), nickel (Ni), magnesium (Mg), and silver (Ag) can be used.

In such a Cu wiring structure, no such problem in the prior art that resistivity of Cu wiring is increased under the influence of electron scattering owing to the additional element remaining in the bulk Cu 6c and under the influence of boundary scattering of electrons owing to a reduction in size of crystal grains occurs. In addition, by such a structure of Cu metal wiring, electron scattering owing to the additional element in the bulk Cu 6b can be suppressed, whereby transmission delay of wiring can be improved. In addition, on Cu crystal grain boundaries and vicinities 7b of the crystal grain boundaries which serve as diffusion paths of Cu for void formation, the additional element or compounds including the additional element are precipitated, whereby Cu diffusion is suppressed.

Furthermore, when an element which is higher in reducibility than Cu and is easily oxidized is used as an additional element, even if the Cu metal wiring is exposed to oxygen or vapor, the additional element which is present on the boundaries is first oxidized, and the oxidized additional element functions as a barrier to prevent Cu oxidation, therefore, provided is an effect of a Cu oxidation prevention and erosion prevention. In addition, by forming a layer of an element which is higher in reducibility than Cu and is easily oxidized on the Cu surface, provided are an effect to suppress Cu from oxidizing in heat treatment and a gettering effect for oxygen and impurities which are present on the Cu surface and inside Cu. The oxygen which is present on the Cu surface and in Cu can diffuse during heat treatment and oxidize a barrier film of a lower layer, and in this case, adhesion between the Cu and barrier metal is deteriorated, which exerts a harmful effect on reliability of wiring. Gettering of oxygen which is present on the Cu surface and in Cu also leads to suppressing barrier metal from oxidizing, which is effective for an improvement in reliability of Cu wiring.

Herein, as Cu migration paths which causes the problem of reliability of Cu wiring, it has been indicated in a publication ((Electromigration path in Cu thin-film lines), (Applied Physics Letters, USA, American Institute of Physics, published on May 17, 1999), Vol. 74, p 2945-2947) and the like that, as regards EM, diffusion at interfaces between the Cu crystal grains and the barrier insulating films or between the Cu crystal grain boundaries is more dominant than diffusion in bulk Cu.

In addition, as regards to SM, as well, since voids owing to SM are formed at crystal grain boundaries, it is considered that the Cu crystal grain boundaries serve as diffusion paths. Therefore, it is considered important for an improvement in reliability of Cu metal wiring to suppress interfacial and grain boundary diffusion. Accordingly, it is considered that Cu metal wiring is improved in reliability by alloying because, as a result of precipitation of an added impurity element at interfaces between the Cu crystal grains and the other layers or between the Cu crystal grain boundaries, Cu diffusion via the interfaces between the Cu crystal grains and the other layers and between the Cu crystal grain boundaries is suppressed.

In the present invention, by suppressing alloying of bulk Cu and introducing the additional element into only the interfaces between the Cu crystal grains and the other layers and between the Cu crystal grain boundaries, a rise in resistance of Cu wiring is suppressed, thus provision of highly reliable Cu metal wiring with EM and SM resistance is realized.

Next, a method for manufacturing a semiconductor device having Cu wiring of the first embodiment will be described with reference to FIGS. 2(a) through (j).

Figure 2:
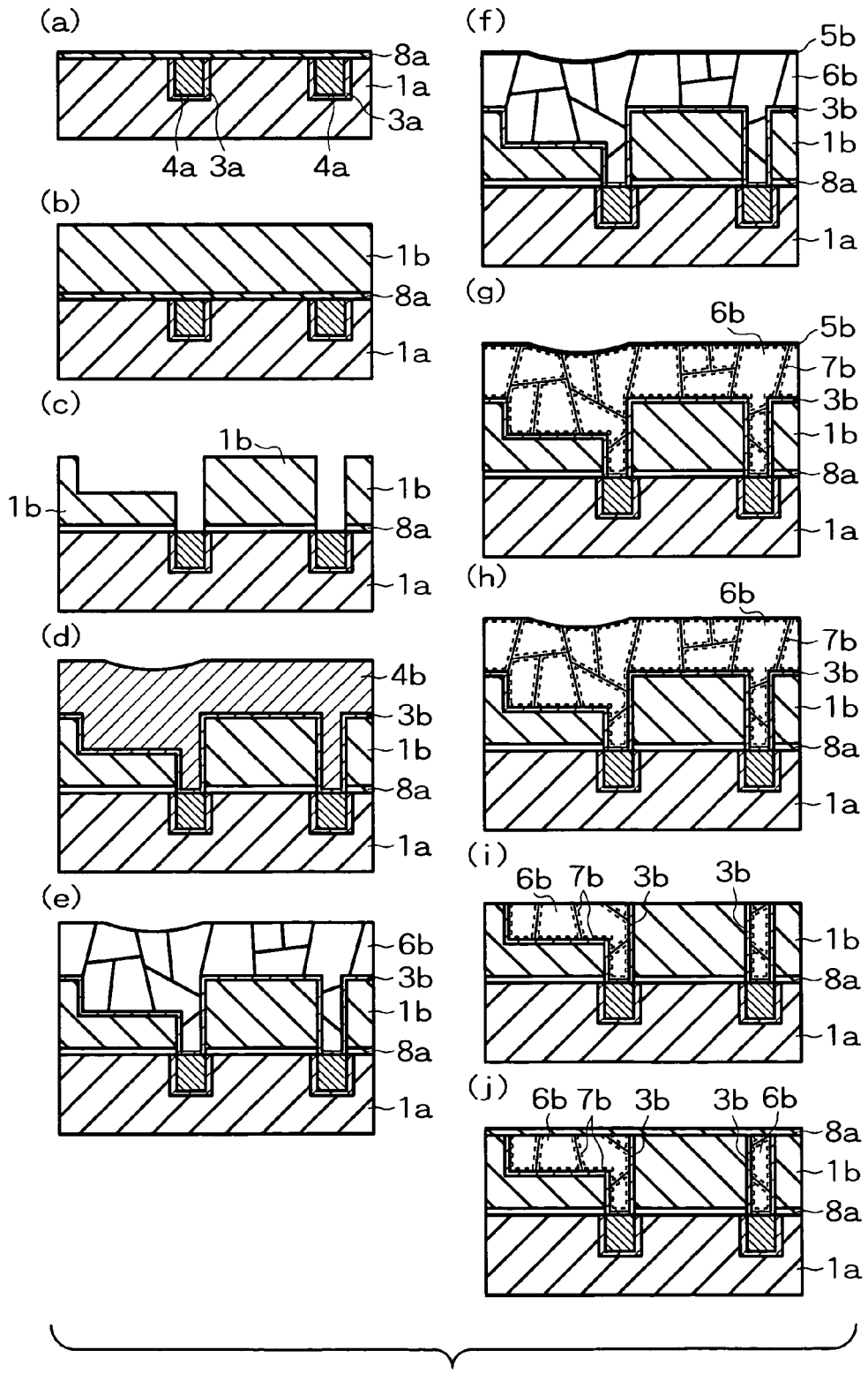
FIGS. 2(a) through (j) are sectional views showing a method for manufacturing a semiconductor device according to the first embodiment of the present invention in the order of steps.

FIG. 2(a) shows lower-layer wiring on which upper-layer wiring is to be formed. This lower-layer wiring is composed of an insulating film 1a, a barrier metal film 3a, Cu 4a, and a barrier insulating film 8a. This lower-layer wiring part is also formed by use of processes similar to those of the upper-layer wiring shown in the following.

As shown in FIG. 2(b), an insulating film 1b is formed on this lower-layer wiring, and then as shown in FIG. 2(c), in the insulating film 1b, wiring grooves and wiring holes are formed by lithography and anisotropic etching. Thereafter, as shown in FIG. 2(d), a barrier metal film 3b is formed on the formed wiring grooves and wiring holes, and Cu 4b is buried therein. Next, and as shown in FIG. 2(e), heat treatment for grain growth of Cu is applied. This heat treatment is performed at a low temperature of not more than 400° C., and, preferably, not more than 300° C. It is also possible to omit this heat treatment for Cu grain growth.

Thereafter, as shown in FIG. 2(f), a layer 5b of an element to be added to the inside of Cu crystals is formed on the surface of the Cu 4b. Next, as shown in FIG. 2(g), heat treatment to diffuse the additional element 5b into the Cu crystals 4b is applied. The temperature of this heat treatment is set to 300° C. to 500° C., and the time is set to ten minutes to 1 hour.

Next, as shown in FIG. 2(h), an excessive additional element layer 5b is removed by wet etching. For a removal of the additional element layer 5b, CMP may be used in place of wet etching. Subsequently, as shown in FIG. 2(i), an excessive Cu 6b and barrier metal layer 3b excluding the wiring grooves and wiring holes are removed by CMP. Next, as shown in FIG. 2(j), a barrier insulating film 8b to prevent Cu from corroding and diffusing is formed on the entire front surface.

By repeating the steps of FIG. 2(b) to FIG. 2(j), wiring of a more upper layer can be formed.

In the above manufacturing method, although formation of the additional element layer 5b (FIG. 2(f)) and diffusion of the additional element into the Cu polycrystal (FIG. 2(g)) have been separately performed, it is also possible to simultaneously perform formation of the additional element layer 5b and diffusion of the additional element into the Cu polycrystal by forming the additional element layer 5b at a high temperature. By simultaneously performing these two steps, the number of steps can be reduced, thus a semiconductor device having Cu wiring can be more simply manufactured. Here, temperature and time when the two steps are simultaneously performed as such may be provided similarly to those of heat treatment to diffuse the additional element into Cu crystals. The same applies to respective embodiments to be described in the following.

In addition, although, in the present embodiment, Cu has been buried after the barrier metal film 3b was formed, the barrier metal film 3b is not an essential construction and may not be formed. Here, by forming the barrier metal film 3b, diffusion of the Cu 6b into the insulating film 1b can be suppressed.

In addition, although, in the above, a description has been given by use of a dual damascene method for simultaneously forming wiring grooves and wiring holes, the invention is also similarly applied to a wiring layer formation when a single damascene method for forming only wiring grooves or only wiring holes is used. Here, in the present invention, the wiring grooves and wiring holes are also collectively referred to as concavities for wiring.

Second Embodiment

A Cu wiring structure of a semiconductor device according to a second embodiment of the present invention will be described with reference to FIG. 3.

Figure 3:
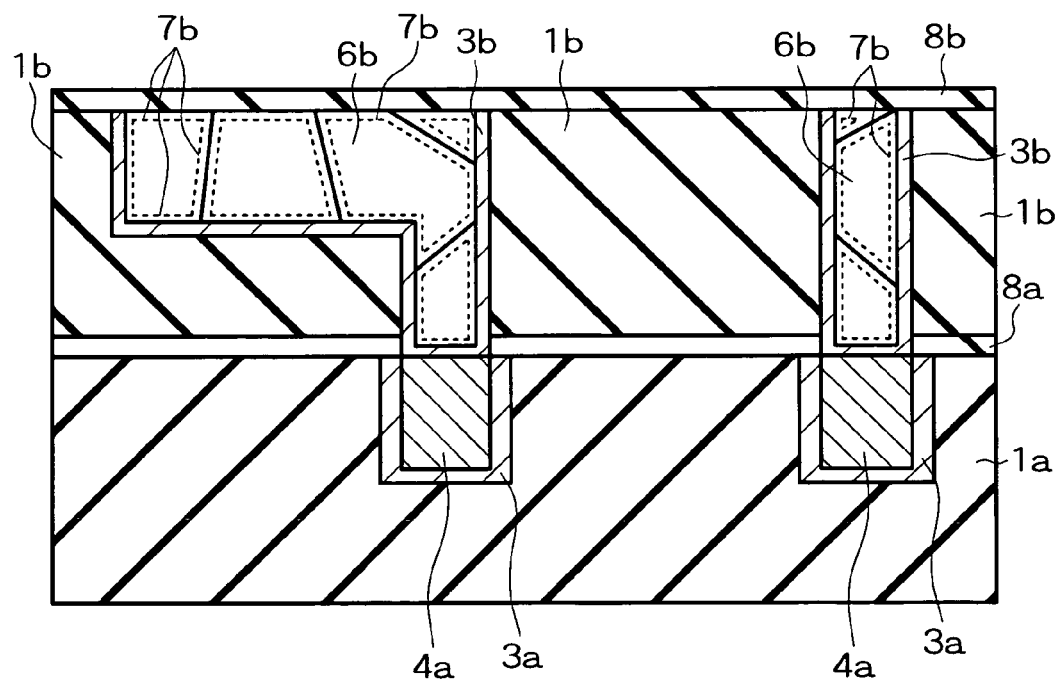
FIG. 3 is a sectional view showing a semiconductor device according to a second embodiment of the present invention.

In the Cu wiring structure shown in FIG. 3, in addition to the construction of the first embodiment, a stable intermetallic compound layer of Cu with an additional element is formed at interfaces between the barrier insulating film 8b and Cu crystal grains 6b. Thereby, adhesion between the Cu 6b, which is a metal for wiring, and barrier insulating film 8b is improved, thus reliability of wiring is improved.

Next, a method for manufacturing a semiconductor device having Cu wiring of the second embodiment will be described with reference to FIG. 4(a) through (j).

Although the manufacturing method of the second embodiment is different from that of the first embodiment in a point that an additional element layer 5b is formed after an excessive Cu 6b and an excessive barrier metal 3b are removed by CMP, others are the same.

Figure 4:
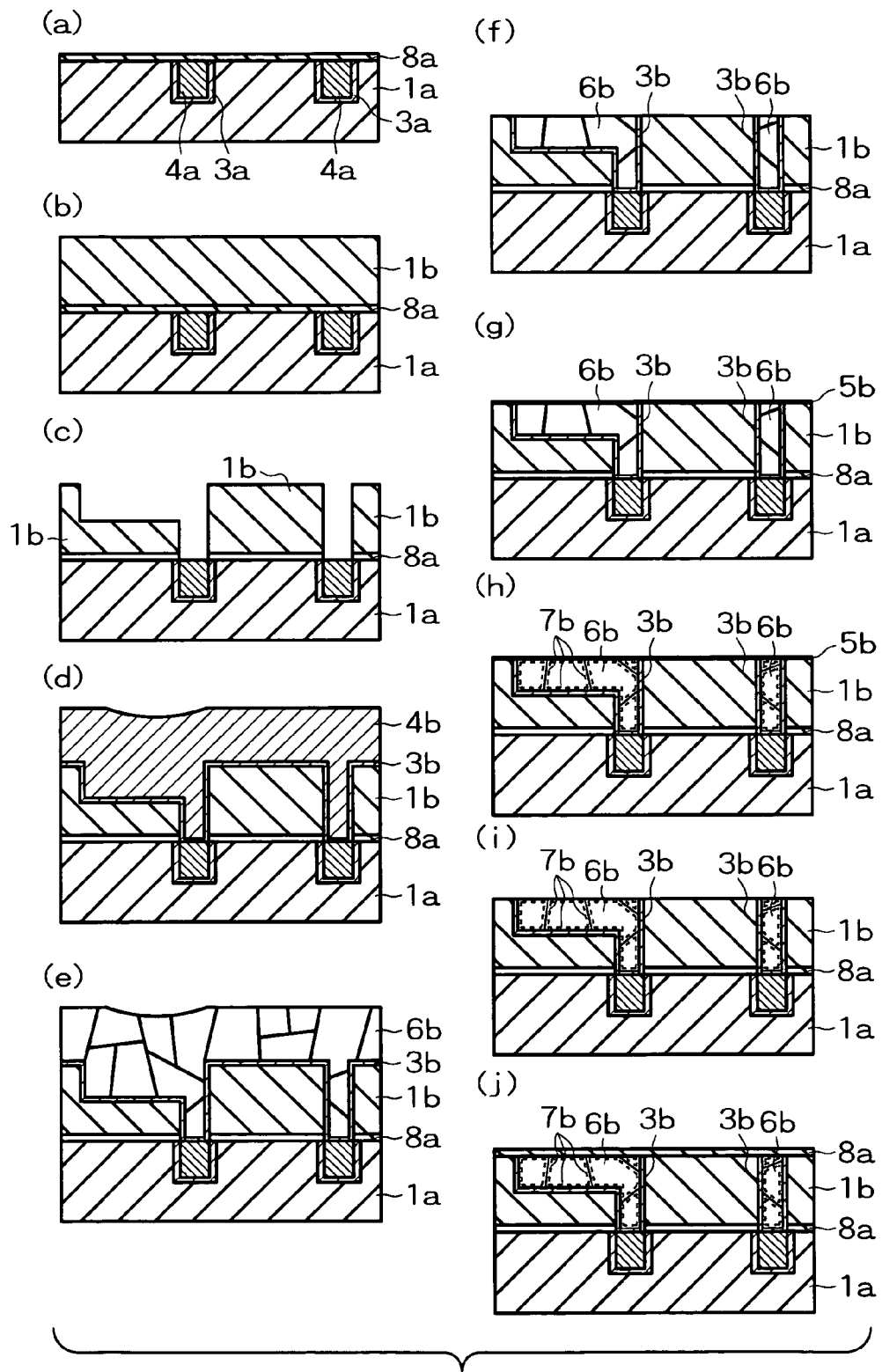
FIGS. 4(a) through (j) are sectional views showing a method for manufacturing a semiconductor device according to the second embodiment of the present invention in the order of steps.

FIG. 4(a) shows lower-layer wiring on which upper-layer wiring is to be formed. This lower-layer wiring part is also formed by use of processes similar to those of the upper-layer wiring shown in the following.

As shown in FIG. 4(b), an insulating film 1b is formed on this lower-layer wiring, and then as shown in FIG. 4(c), in the insulating film 1b, wiring grooves and wiring holes are formed by lithography and anisotropic etching. Thereafter, as shown in FIG. 4(d), a barrier metal film 3b is formed, and Cu 4b is buried. Next, and as shown in FIG. 4(e), heat treatment for grain growth of the buried Cu is applied. This heat treatment is performed at a low temperature of not more than 400° C., and, preferably, not more than 300° C. It is also possible to omit this heat treatment for Cu grain growth.

Thereafter, as shown in FIG. 4(f), excessive Cu and an excessive barrier metal excluding the wiring grooves and wiring holes are removed by CMP. Next, as shown in FIG. 4(g), a layer 5b of an element to be added into the Cu is formed on the Cu surface. Next, as shown in FIG. 4(h), heat treatment to diffuse the additional element into the Cu is applied. The temperature of this heat treatment is set on the order of 300° C. to 500° C., and the time is set on the order of 10 minutes to 1 hour.

Next, as shown in FIG. 4(i), an excessive additional element layer 5b is removed by wet etching. For a removal of the additional element layer 5b, CMP may be used in place of wet etching. Next, as shown in FIG. 4(j), a barrier insulating film 8b to prevent Cu from corroding and diffusing is formed on the entire front surface.

By repeating FIG. 4(b) to FIG. 4(j), wiring of a more upper layer can be formed.

In the above manufacturing method, although formation of the additional element layer 5b (FIG. 4(g)) and diffusion of the additional element into the Cu polycrystal (FIG. 4(h)) have been separately performed, it is also possible to simultaneously perform formation of the additional element layer 5b and diffusion of the additional element into the Cu polycrystal by forming the additional element layer 5b under a high-temperature condition. By simultaneously performing these two steps, the number of steps can be reduced, thus a semiconductor device having Cu wiring can be more simply manufactured.

In addition, although a description has been given in the above by use of a dual damascene method for simultaneously forming wiring grooves and wiring holes, the invention is also similarly applied to a formation of concavities for wiring when a single damascene method for forming only wiring grooves or only wiring holes is used.

Third Embodiment

A Cu wiring structure of a semiconductor device according to a third embodiment of the present invention will be described with reference to FIG. 5.

Figure 5:
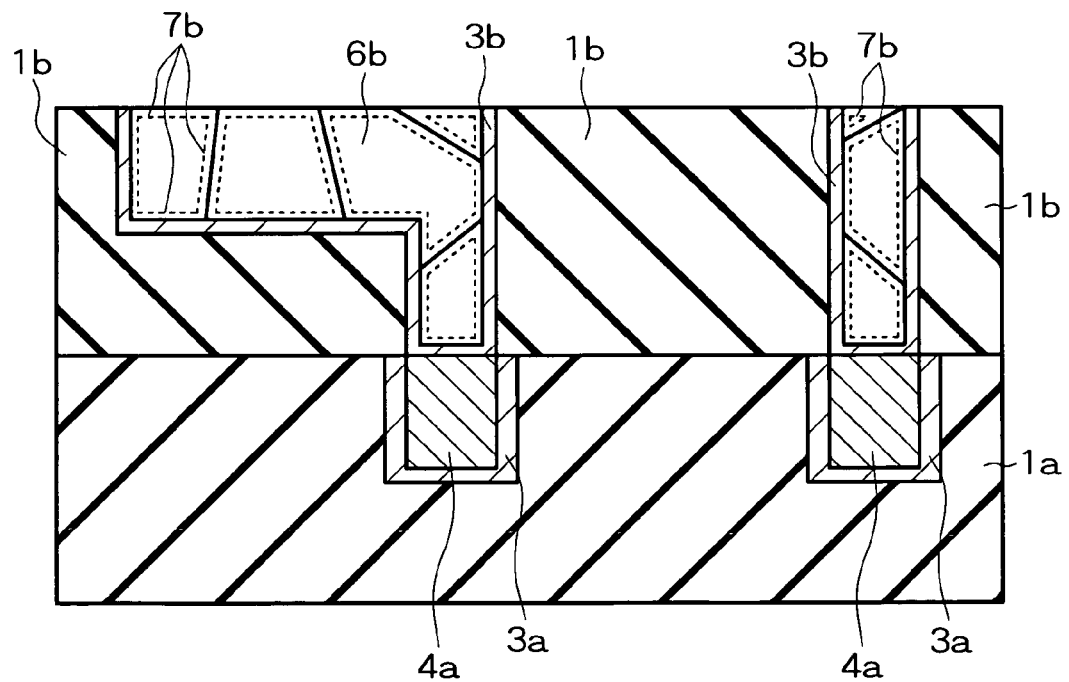
FIG. 5 is a sectional view of a semiconductor device according to a third embodiment of the present invention.

The wiring structure of the third embodiment shown in FIG. 5 is different from the structure of the second embodiment in a point that no barrier insulating film 8b is used. In the third embodiment, since, by forming a stable intermetallic compound layer on the Cu surface, oxidation and corrosion of the Cu are prevented, the barrier insulating film 8b becomes unnecessary. Since an effective dielectric constant of Cu wiring is lowered by providing no barrier insulating film 8b, transmission delay can be improved.

Next, a method for manufacturing a semiconductor device having Cu wiring of the third embodiment will be described with reference to FIG. 6(a) through (i).

Figure 6:
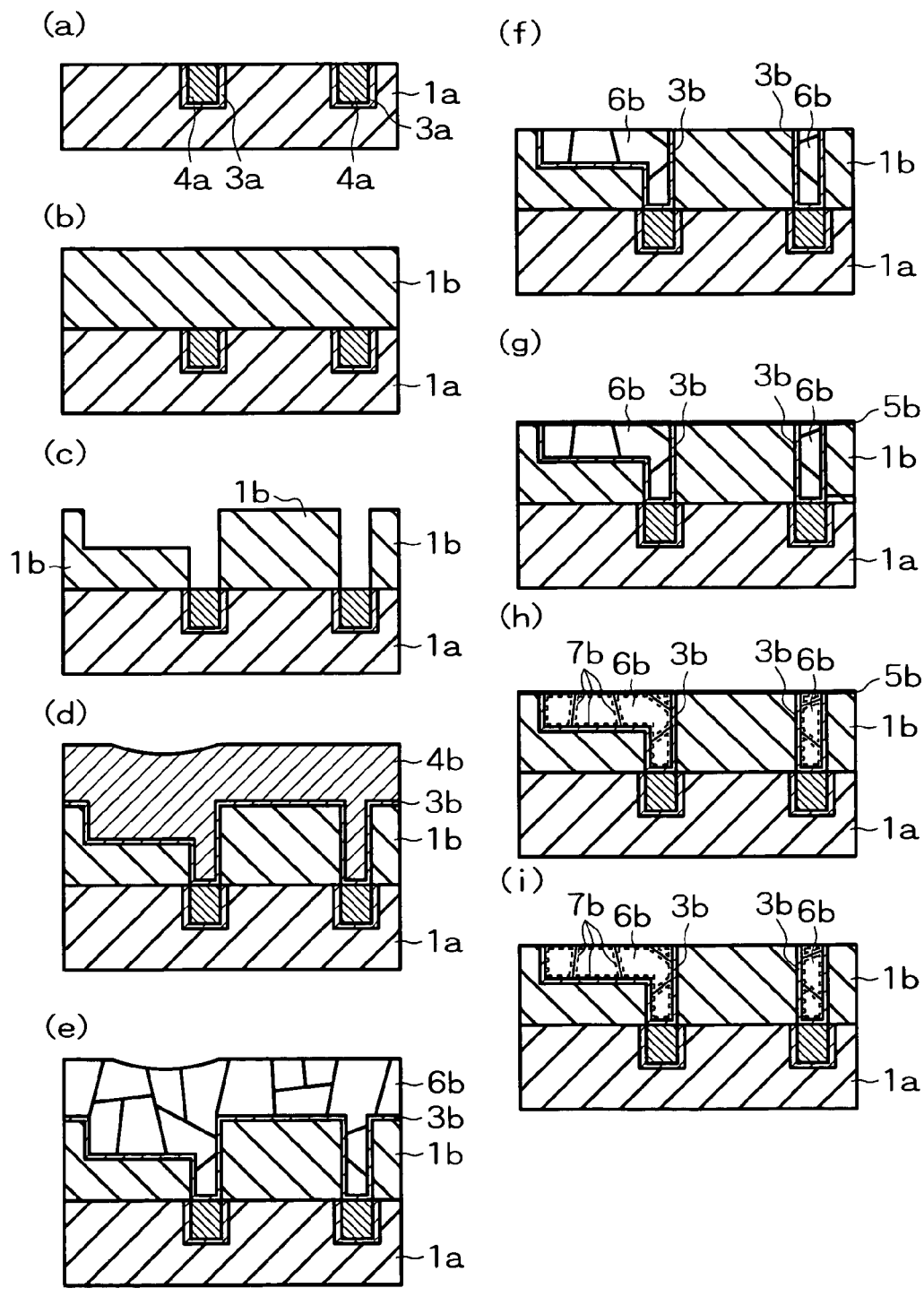
FIGS. 6(a) through (i) are sectional views showing a method for manufacturing a semiconductor device according to the third embodiment of the present invention in the order of steps.

FIG. 6(a) shows a lower-layer wiring on which an upper-layer wiring is to be formed. This lower-layer wiring part is also formed by use of processes similar to those of the upper-layer wiring shown in the following.

As shown in FIG. 6(b), an insulating film 1b is formed on this lower-layer wiring, and then as shown in FIG. 6(c), in the insulating film 1b, wiring grooves and wiring holes are formed by lithography and anisotropic etching. Thereafter, as shown in FIG. 6(d), a barrier metal film 3b is formed, and Cu 4b is buried. Next, and as shown in FIG. 6(e), heat treatment for growth of Cu crystal grains is applied. This heat treatment is performed at a low temperature of not more than 400° C., and, preferably, not more than 300° C. It is also possible to omit this heat treatment for Cu grain growth.

Thereafter, as shown in FIG. 6(f), an excessive Cu and barrier metal excluding the wiring grooves and wiring holes are removed by CMP. Next, as shown in FIG. 6(g), a layer 5b of an element to be added to the inside of Cu is formed on the Cu surface. Next, as shown in FIG. 6(h), heat treatment to diffuse the additional element into Cu is applied. The temperature of this heat treatment is set to 300° C. to 500° C., and the time is set to 10 minutes to 1 hour.

Next, as shown in FIG. 6(i), an excessive additional element layer 5b is removed by wet etching. For a removal of the additional element layer 5b, CMP may be used in place of wet etching.

By repeating FIG. 6(b) to FIG. 6(i), wiring of a more upper layer can be formed.

In the above manufacturing method, although formation of the additional element layer 5b (FIG. 6(g)) and diffusion of the additional element into the Cu polycrystal (FIG. 6(h)) have been separately performed, it is also possible to simultaneously perform formation of the additional element layer 5b and diffusion of the additional element into the Cu polycrystal by forming the additional element layer 5b at a high temperature. By simultaneously performing these two steps, the number of steps can be reduced, thus a semiconductor device having Cu wiring can be more simply manufactured.

In addition, although a description has been given in the above by use of a dual damascene method for simultaneously forming wiring grooves and wiring holes, the invention is also similarly applied to a formation of concavities for wiring when a single damascene method for forming only wiring grooves or only wiring holes is used.

Hereinafter, characteristics of an example and a comparative example of the present invention are compared, and effects of the present invention will be described.

EXAMPLE

FIGS. 7(a) through (k) and FIGS. 8(l) through (s) are sectional views showing a method for manufacturing a semiconductor device in an example of the present invention in the order of steps.

A 1000 nm $SiO_2$ film (insulating film) 1a was formed on a silicon substrate (unillustrated), thereon a first wiring layer (wiring grooves) was formed by a single damascene method, and then, on the top thereof, by a dual damascene method, a second wiring layer (wiring grooves) and contact holes (wiring holes) with the first wiring layer were formed. The details will be described in the following.

Figure 7:
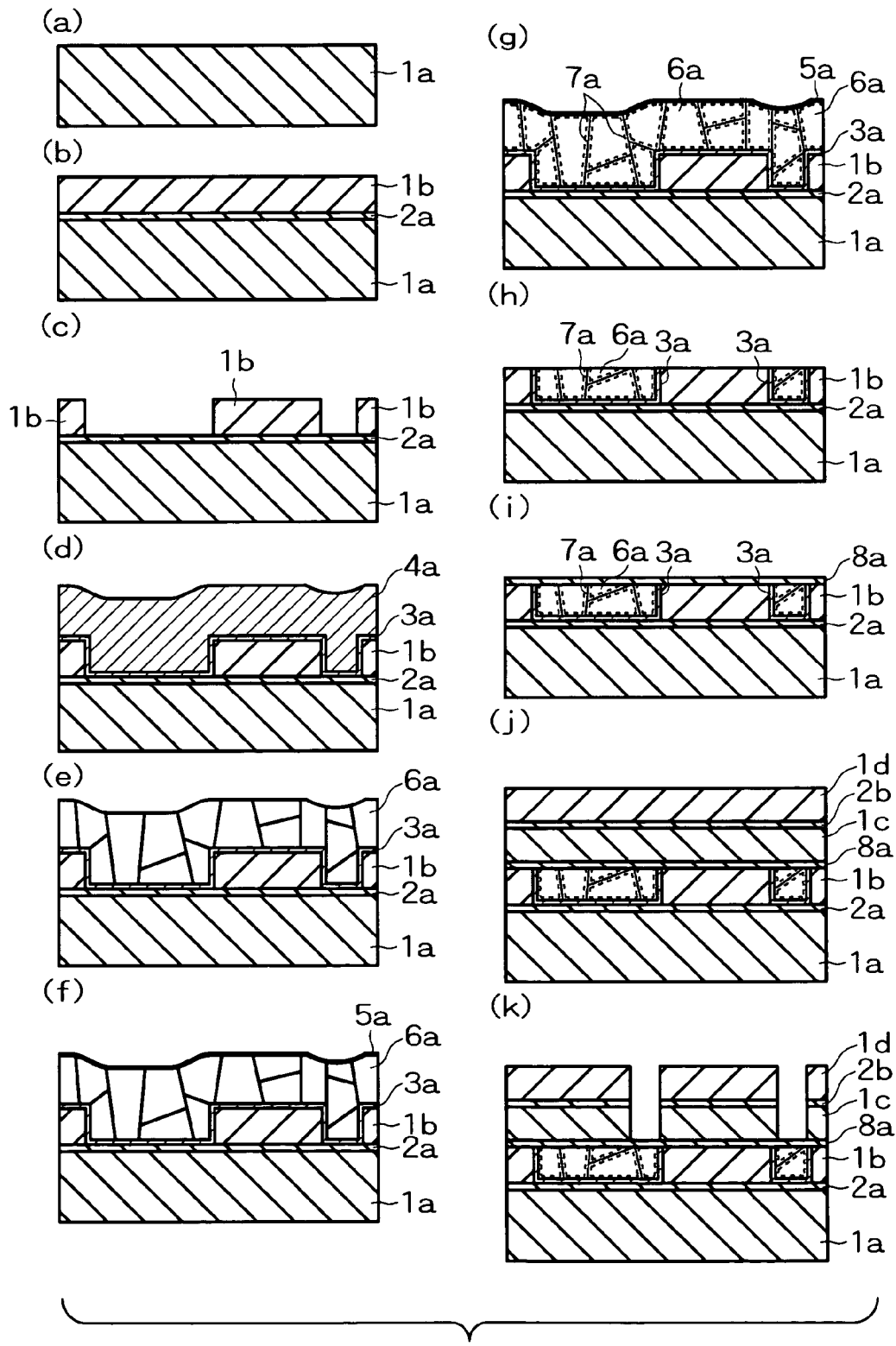
FIGS. 7(a) through (k) are sectional views showing former steps in an example of the present invention in the order of steps.

On the $SiO_2$ film 1a (FIG. 7(a)), a SiC film (stopper insulating film) 2a with a thickness of 50 nm to be an etching stopper was formed, and subsequently, as shown in FIG. 7(b), a $SiO_2$ film (insulating film) 1b with a thickness of 350 nm to insulate wirings each other in the first wiring layer was formed, and as shown in FIG. 7(c), wiring grooves were formed, by lithography and etching, in the $SiO_2$ film 1b. Thereafter, as shown in FIG. 7(d), a barrier metal film 3a composed of a TaN film and a Ta film and a 100 nm Cu thin film were formed on the entire surface of a substrate surface, and while using this Cu film as an electrode, Cu 4a was buried by an ionization sputtering method.

Next, as shown in FIG. 7(e), after applying heat treatment in a nitrogen atmosphere for Cu crystal grain growth, as shown in FIG. 7(f), a Ti film (additional element layer) 5a with a film thickness of 20 nm was formed on the entire Cu front surface by sputtering.

Subsequently, as shown in FIG. 7(g), a heat treatment at 350° C. for 30 minutes was performed in a nitrogen atmosphere, whereby Ti was diffused into Cu from the Cu surface. Here, since Ti is diffused via Cu crystal grain boundaries and is hardly diffused into bulk, formed is a structure wherein Ti is contained in large quantity in vicinities 7a of Cu crystal grain boundaries and Ti is hardly existed in bulk Cu 6a.

Next, as shown in FIG. 7(h), excessive Ti was removed by hydrofluoric acid, and subsequently by CMP, respective layers of excessive Cu, Ta, and TaN were removed. On this entire front surface, as shown in FIG. 7(i), a SiCN layer (barrier insulating film) 8a with a thickness of 50 nm was formed by a plasma CVD method, whereby a first wiring layer was formed.

Furthermore, as shown in FIG. 7(j), a SiO$_2$ film (insulating film) 1c, a SiC film (stopper insulating film) 2b, a SiO$_2$ film (insulating film) 1d were formed at thicknesses of 400 nm, 50 nm, and 400 nm, respectively, by a plasma CVD method, and as shown in FIG. 7(k), by lithography and anisotropic dry etching, parts of the SiO$_2$ film 1c, SiC film 2b, and SiO$_2$ film 1d were removed in order while using the SiCN 8a as an etching stopper, whereby main parts of contact holes (wiring holes) between the first wiring layer and second wiring layer were formed.

Figure 8:
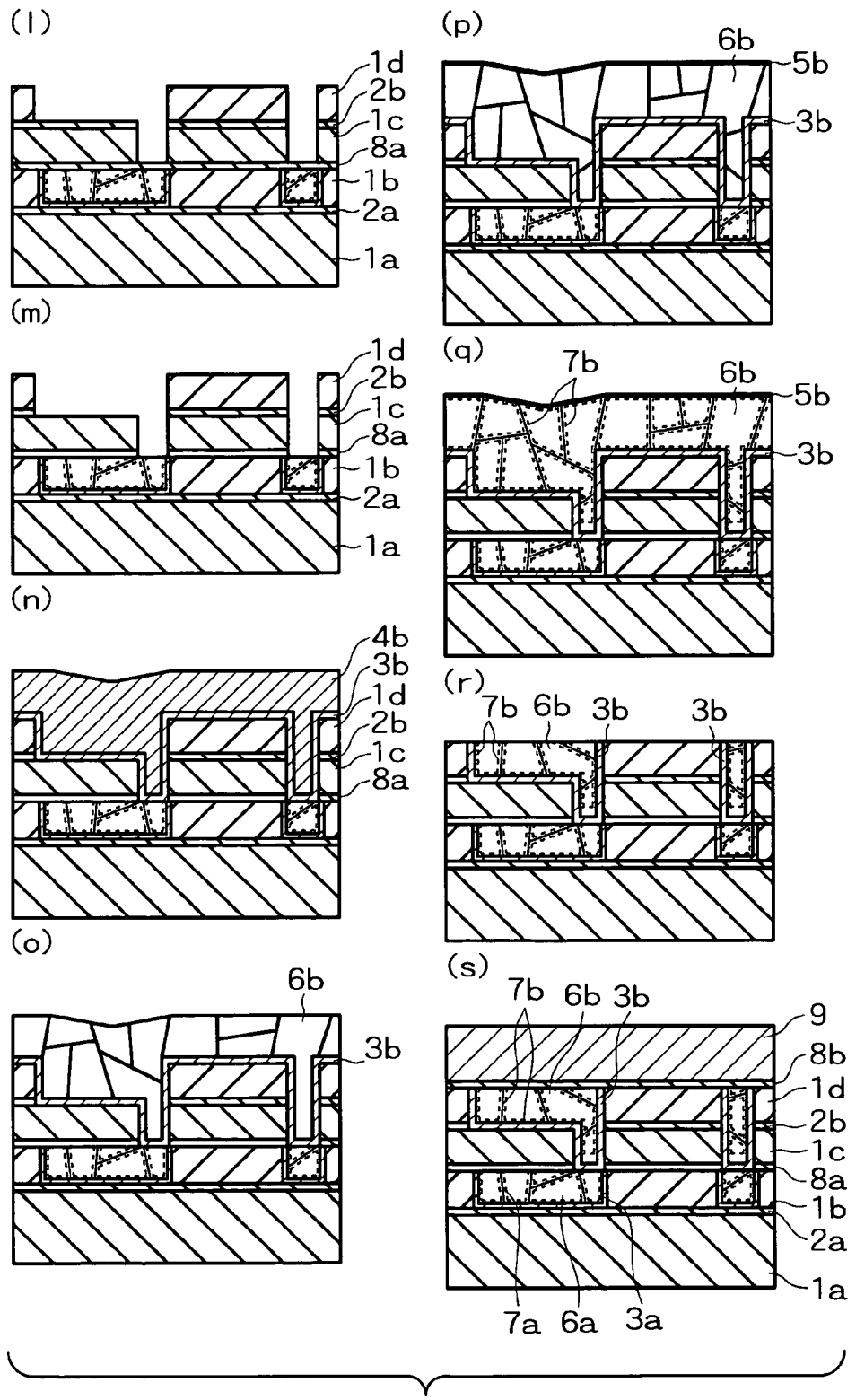
FIGS. 8(l) through (s) are similarly sectional views showing latter steps in an example of the present invention in the order of steps.
Figure 9:
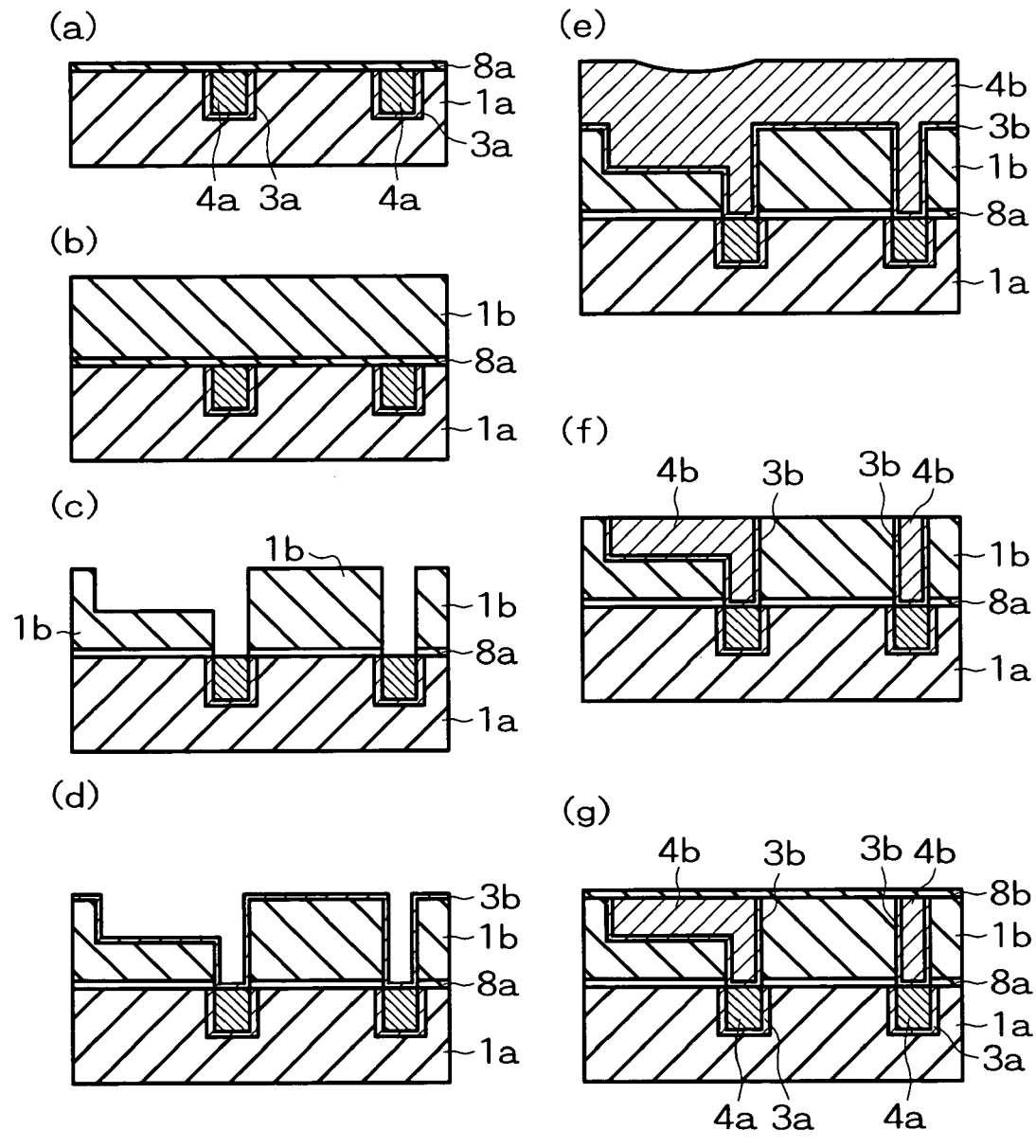
FIGS. 9(a) through (g) are sectional views explaining a method for manufacturing a semiconductor device according to the prior art.
Figure 10:
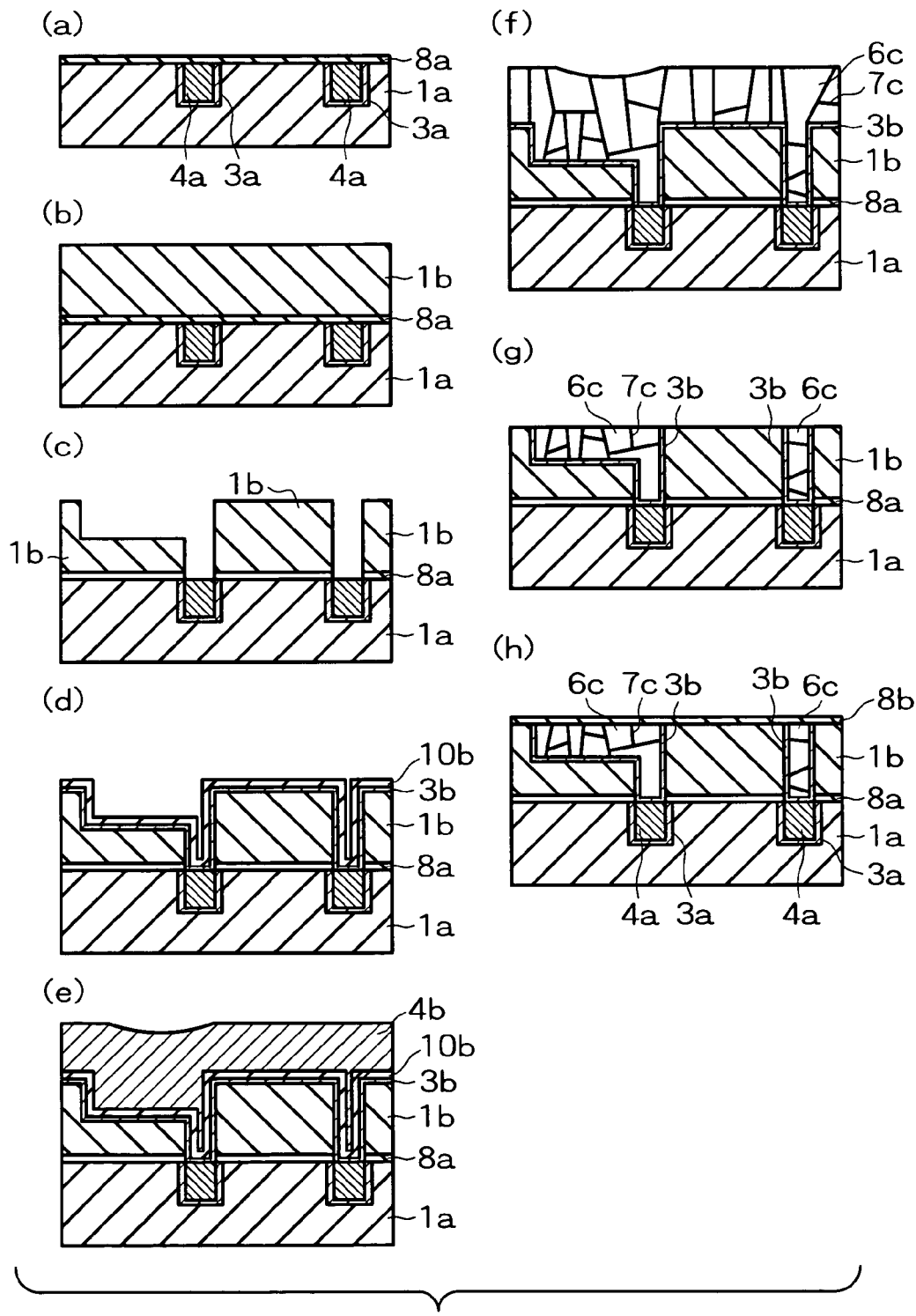
FIGS. 10(a) through (h) are sectional views explaining another example of a method for manufacturing a semiconductor device according to the prior art.

Subsequently, as shown in FIG. 8(l), by lithography and anisotropic etching, while using the SiC film 2b as an etching stopper, part of the SiO$_2$ film 1c was removed, whereby main parts of wiring grooves of the second wiring layer were formed. Next, as shown in FIG. 8(m), the SiCN film 8a on bottom portions of the contact holes between the first wiring layer and second wiring layer and the SiC film 2b on bottom portions of the second wiring grooves were removed by anisotropic etching, whereby an upper contact surface of the first wiring layer was exposed.

Next, by slightly etching the front surface by Ar ions in a vacuum system, the surface of the first wiring layer exposed from the bottoms of contact holes between the first wiring layer and second wiring layer was cleaned.

Next, while maintaining a vacuum, in order to coat the inner surfaces of the wiring grooves of the second wiring layer and the contact holes between the first wiring layer and the second wiring layer, by procedures similar to those for a first wiring layer formation, as shown in FIG. 8(n), a barrier metal film 3b provided by laminating a TaN film and a Ta film in this order and a 100 nm Cu thin film were formed by an ionization sputtering method, and while using this Cu thin film as a seed, Cu 4b was buried by an electrolytic plating method.

Next, as shown in FIG. 8(o), simultaneously with a first wiring layer formation, after heat treatment was applied for Cu crystal grain growth in a nitrogen atmosphere, as shown in FIG. 8(p), a Ti film (additional element layer) 5b with a film thickness of 20 nm was formed on the entire Cu front surface by sputtering. Subsequently, as shown in FIG. 8(q), a heat treatment at 350° C. for 30 minutes was performed in a nitrogen atmosphere, whereby Ti was diffused into Cu from the Cu surface.

Next, as shown in FIG. 8(r), excessive Ti was removed by hydrofluoric acid, and subsequently by CMP, respective layers of excessive Cu, Ta, and TaN were removed. Thereafter, as shown in FIG. 8(s), on this entire front surface, a SiCN layer (barrier insulating film) 8b with a thickness of 50 nm was formed by a plasma CVD method, and furthermore, a SiO$_2$ film 9 was formed as a cover film.

After opening junctions with the second wiring layer in the cover film 9 by lithography and etching, Ti film, TiN film, and Al film were formed by sputtering in order, and an Al/TiN/Ti laminated film was processed into a pad pattern for electrometry by lithography and etching.

COMPARATIVE EXAMPLE

As a comparative example, a conventional semiconductor device having Cu wiring composed of upper-layer and lower-layer wiring was fabricated as shown in the foregoing FIG. 9(a) through (g). The substrate, insulating film, stopper insulating film, barrier metal film, barrier insulating film, and cover insulating film were formed, by use of materials similar to those of the aforementioned embodiment, with similar thicknesses and by a similar forming method. Here, Ti, which was an additional element in the embodiment, was not added.

(Results of Evaluation)

Figure 11:
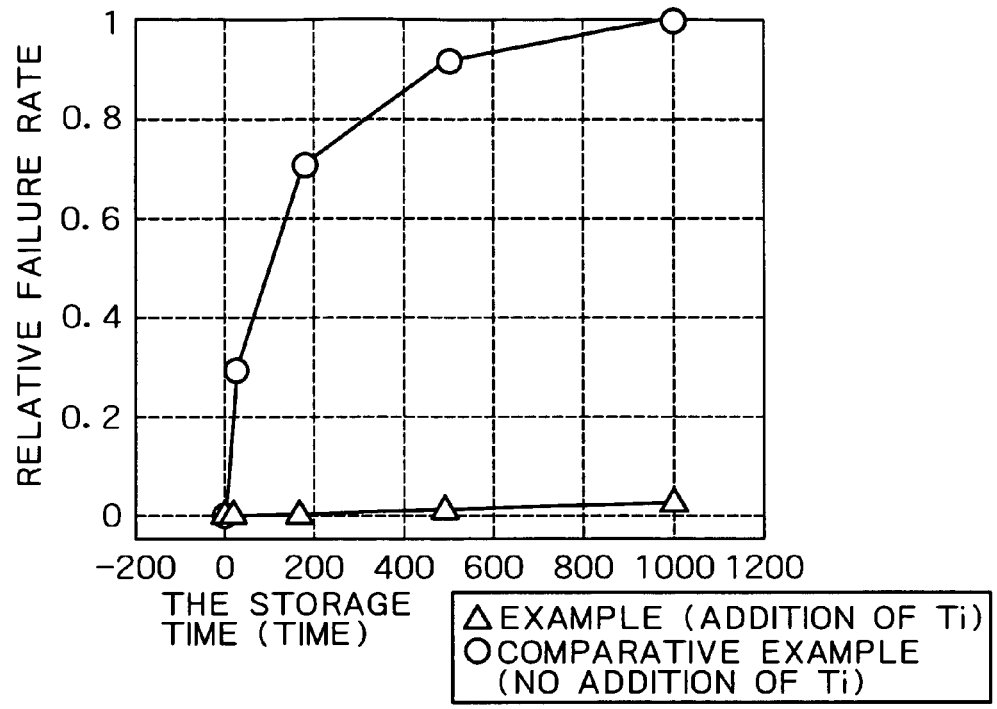
FIG. 11 is a graph explaining a relationship between the storage time and relative failure rate of via chains fabricated by an example and a comparative example.

FIG. 11 shows failure rates of respective samples fabricated by the example and comparative example. Namely, respective samples of a via chain with a chain number (number of vias) of ten thousand, whose contact hole diameter was 0.2 μm and whose lower-layer wiring (wiring grooves) width was 10 μm were fabricated, and failure rates after these were stored for 1000 hours at 150° C. were determined.

As a result of a sample processing by Focused Ion Beam (FIB) and an observation by Transmission Electron Spectroscopy (TEM), it could be confirmed that disconnections in the respective samples were owed to a void formation as a result of stress induced migration at the lower-layer wiring portions 4a of contact holes as reported in the above-described Japanese Published Unexamined Patent Application No. 2001-298084.

In samples of the comparative example, open failures were prominent, and the failure rate was increased with storage time. In addition, in the samples of the comparative example, presence of Cu grain boundaries could be confirmed.

On the other hand, in samples of the example, failure has been remarkably improved. The failure generation rate after the samples were stored at 150° C. for 1000 hours was suppressed to approximately one-fortieth of that of the comparative example. Furthermore, by optimizing the manufacturing processes, failure generation could be completely suppressed even after storage for 1000 hours.

Figure 12:
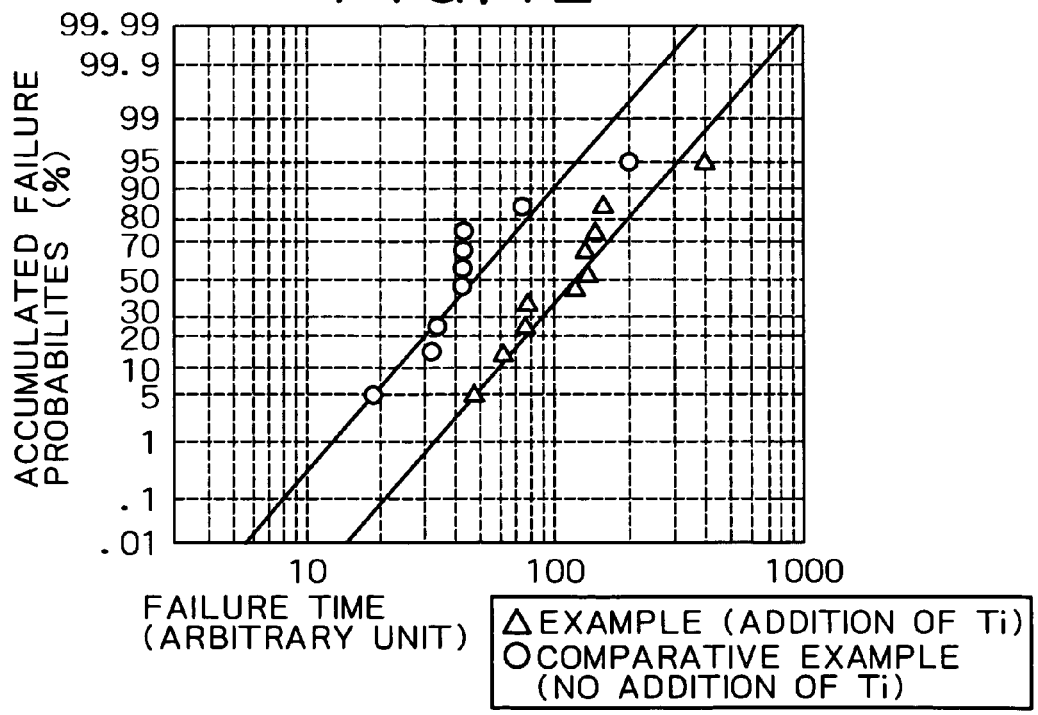
FIG. 12 is a graph showing electromigration resistance of contact holes of via chains fabricated by an example and a comparative example by a relationship between the cumulative time and cumulative failure probability.

FIG. 12 shows test results for electromigration resistance of contact holes (contact vias). Concretely, it shows accumulated failure probabilities with respect to failure time. A test was performed at 300° C. with a condition of a current density of 3.2 MA/cm$^2$, a rise in resistivity of 3% was employed as a judgement criterion for failure. It could be confirmed that the samples of the example had an electromigration resistance not less than two times that of the samples of the comparative example.

It can be considered that, in the example, since diffusion of Cu via grain boundaries can be suppressed by introducing Ti into Cu crystal grain boundaries, stress induced migration resistance and electromigration resistance have been improved.

Figure 13:
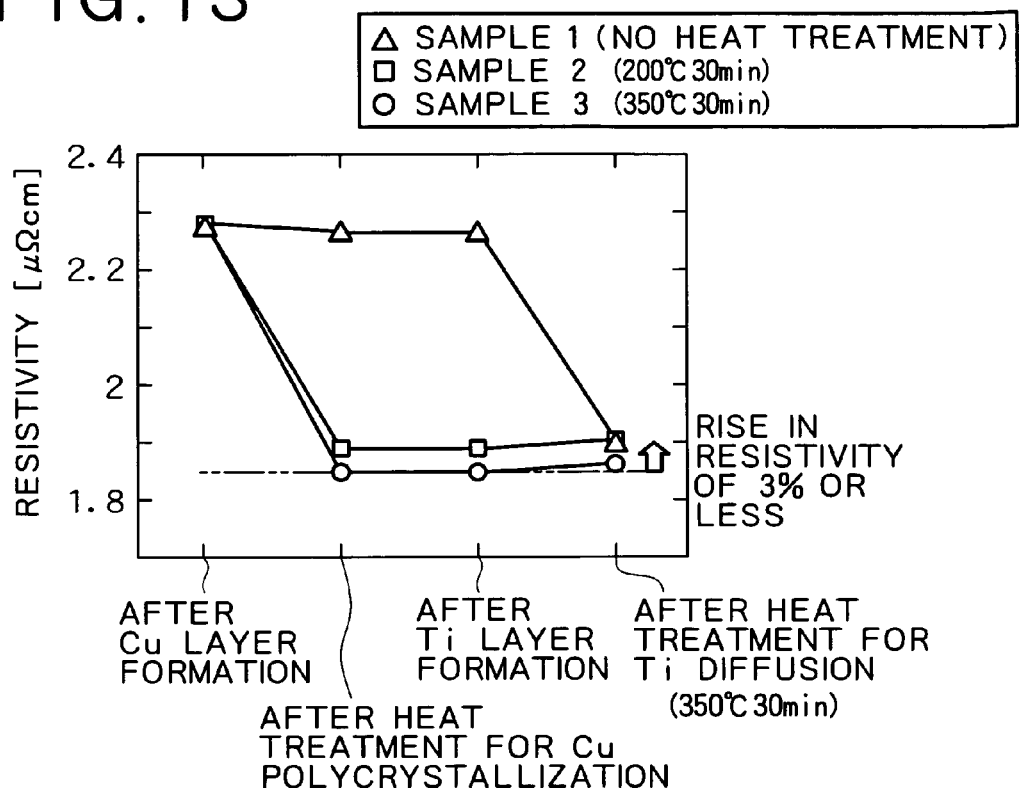
FIG. 13 is a graph showing changes in resistivity of Cu wiring owing to a difference in heat treatment after a Cu layer formation in blanket wafer samples of an example.

FIG. 13 shows plotted changes in resistivity. Samples used for this resistivity measurement are blanket wafer samples which had been fabricated similarly to the procedures of the above-described embodiment except that a Ta/TaN barrier metal film 3a was formed on a SiO$_2$ insulating film 1a, a 700 nm Cu layer was further formed, and a 20 nm Ti additional element layer 5a was formed. Here, in the blanket wafer samples, no wiring holes and wiring grooves were formed. In FIG. 13, resistivities at respective manufacturing stages are shown for three samples of sample 1, sample 2, and sample 3. Herein, sample 1 has received no heat treatment after a Cu film formation before a Ti film formation, sample 2 has received a heat treatment for Cu polycrystallization at 200° C. for 30 minutes in a nitrogen atmosphere after a Cu film formation before a Ti film formation and sample 3 has received a heat treatment for Cu polycrystallization at 350° C. for 30 minutes.

In comparison with the resistivities after a heat treatment for Cu polycrystallization of Sample 3, for which a heat treatment after a Cu film formation has been sufficiently performed, a rise in resistivity after performing a heat treatment to diffuse Ti at 350° C. for 30 minutes after a Ti film formation was suppressed to 3% or less in all samples. As such, a rise in resistivity as a result of a Ti addition from the Cu surface is considerably small. This is because Ti which has been added from the surface diffuses along Cu crystal grain boundaries and is hardly introduced in Cu bulk.

Figure 14:
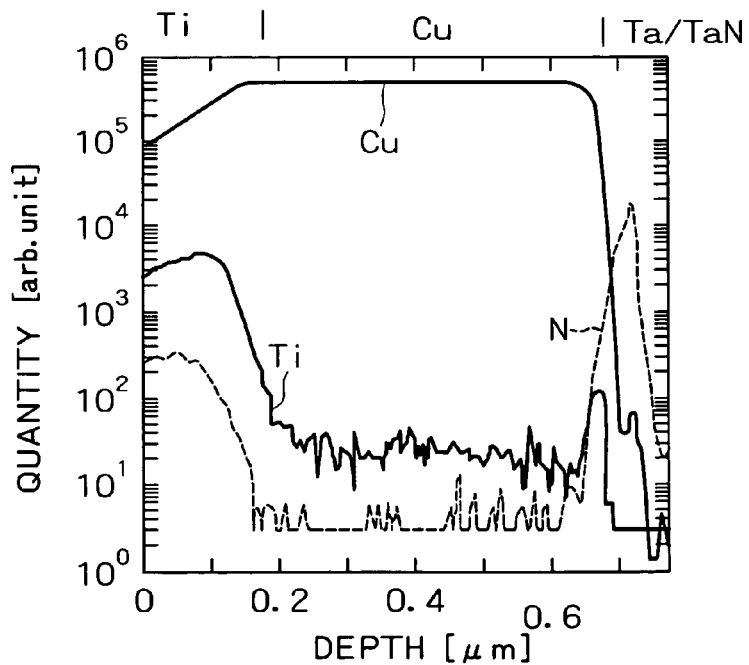
FIG. 14 is a graph showing distributions of Ti, Cu, and N of a barrier metal film, a Cu layer, and an additional element layer in blanket wafer samples of an example.

FIG. 14 shows results of a measurement, in the aforementioned fabricated blanket wafer samples, of distributions of Ti, Cu, and N in Cu by secondary ion mass spectrometry (SIMS). The horizontal axis of the graph in FIG. 14 shows depth of the blanket samples. The vertical axis of the graph in FIG. 14 shows secondary ion intensity measured by SIMS, which corresponds to the quantity of atoms.

Ti with a uniform concentration in a depth direction has been detected in Cu crystals. Since a Ti diffusion coefficient in bulk Cu is not large in a temperature region on the order of 350° C., it is hardly conceived that Ti has diffused in bulk Cu to form a uniform distribution as in FIG. 14, and it is considered that Ti has uniformly diffused up to Cu bottom portions via crystal grain boundaries and has thereby been added. Accordingly, it can be considered that Ti has been hardly mixed in bulk Cu and has been localized at grain boundaries.

Figure 15:
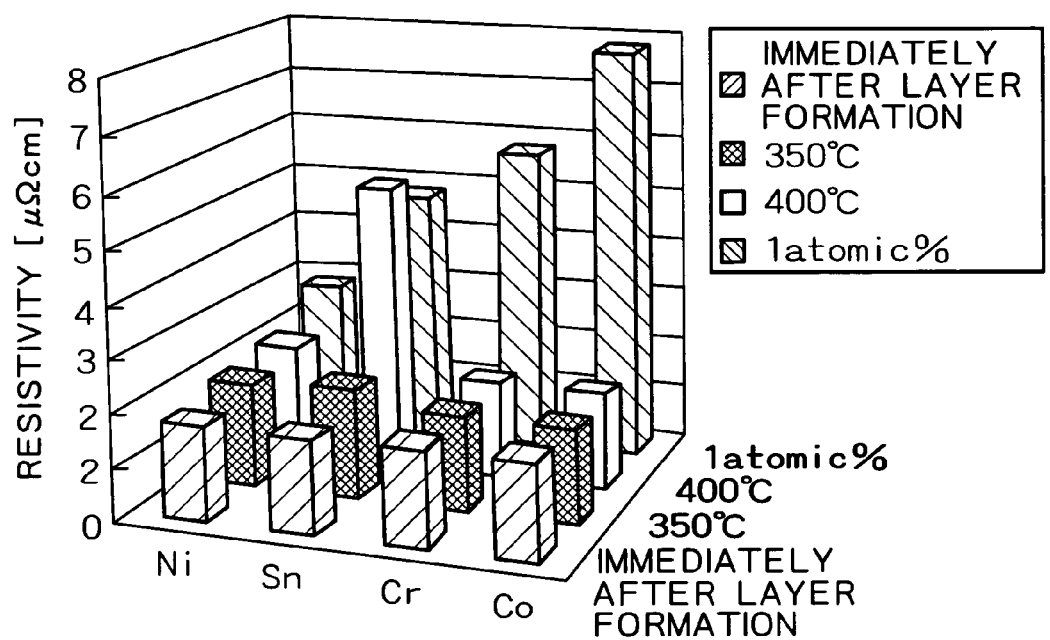
FIG. 15 is a graph showing changes in resistivity of Cu wiring owing to a difference in additional elements and a difference in heat treatment after an additional element layer formation in blanket wafer samples of an example.

FIG. 15 shows a relationship between resistivities owing to a difference in additional elements and heat treatment. Samples used for this resistivity measurement are blanket wafer samples which had been fabricated similarly to the procedures of the above-described embodiment except that a Ta/TaN barrier metal film 3a was formed on a SiO$_2$ insulating film 1a, a 300 nm Cu layer was further formed, and a Ni additional element layer 5a was formed. Here, in the blanket wafer samples, no wiring holes and wiring grooves were formed. Here, a film thickness of the additional element layer was set so that a Ni concentration in Cu becomes 3 atomic % when the additional element Ni has uniformly diffused in Cu. The Ni film was formed by sputtering.

Similarly, respective blanket wafer samples were fabricated by respectively forming respective films of additional elements of Sn, Cr, and Co in place of the additional element Ni. In FIG. 15, in terms of respective blanket wafer samples with additional elements of Ni, Sn, Cr, and Co, shown are resistivities at respective stages after an additional element layer formation, after a heat treatment at 350° C. for 30 minutes in a nitrogen atmosphere, and after a heat treatment at 400° C. for 30 minutes in a nitrogen atmosphere.

In addition, in FIG. 15, for a comparison, resistivity values of Cu where additional element concentration becomes 1 atomic % are shown. Here, these values have been extracted from a publication (authored by C. Kittel, translation supervised by Masao Doyama, "Quantum Theory of Solids," MARUZEN Co., Ltd., published 1972, p 338).

As a result, with regard to Sn and Ni, which are easily solid-solved in Cu, a rise in resistivity was recognized with the rise in heat treatment temperature. Particularly, with regard to Sn, when heat treatment was applied at a temperature of 400° C., a rise in resistivity which is higher than when this was uniformly mixed in Cu at 1 atomic % could be recognized. In contrast thereto, with regard to Cr and Co, whose solid solubility limits in Cu are low and which form precipitated alloys, a rise in resistivity was hardly recognized with the rise in heat treatment temperature. When additional elements which are easily solid-solved in Cu, such as Cr and Co, are used, resistivity rises even if these are added from the Cu surface. Accordingly, as the element to be added from the Cu surface, a precipitating type element whose solid solubility limit in Cu is low is preferable.

Figure 16:
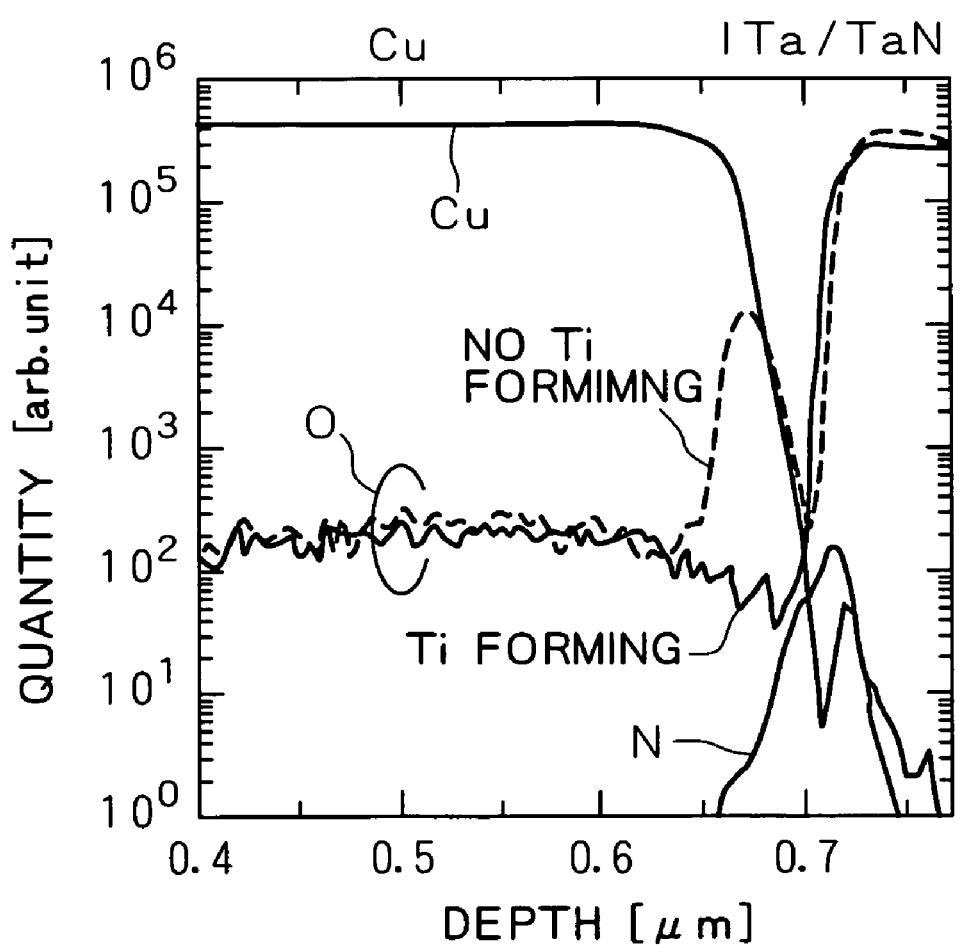
FIG. 16 is a graph diagram showing results of a measurement of oxygen (O) distributions in Cu.

FIG. 16 shows, in terms of a blanket wafer sample which has received a heat treatment at 350° C. for 30 minutes without forming a Ti film on the Cu surface after a Cu film formation and a blanket wafer sample for which Ti film has been formed on the Cu surface after a Cu film formation and which has received a heat treatment at 350° C. for 30 minutes, results of a measurement of oxygen (O) distributions in Cu by SIMS. The horizontal axis of the graph in FIG. 16 shows sample depth. In addition, the vertical axis of the graph in FIG. 16 shows secondary ion intensity measured by SIMS. In the sample which has received a heat treatment at 350° C. for 30 minutes without forming a Ti film on the Cu surface after a Cu film formation, an O peak is recognized in the vicinity of an interface between Cu and Ta, whereas in the sample for which a Ti film has been formed on the Cu surface after a Cu film formation and which has received a heat treatment at 350° C. for 30 minutes, no O peak is recognized in the vicinity of an interface between Cu and Ta.

Figure 17:
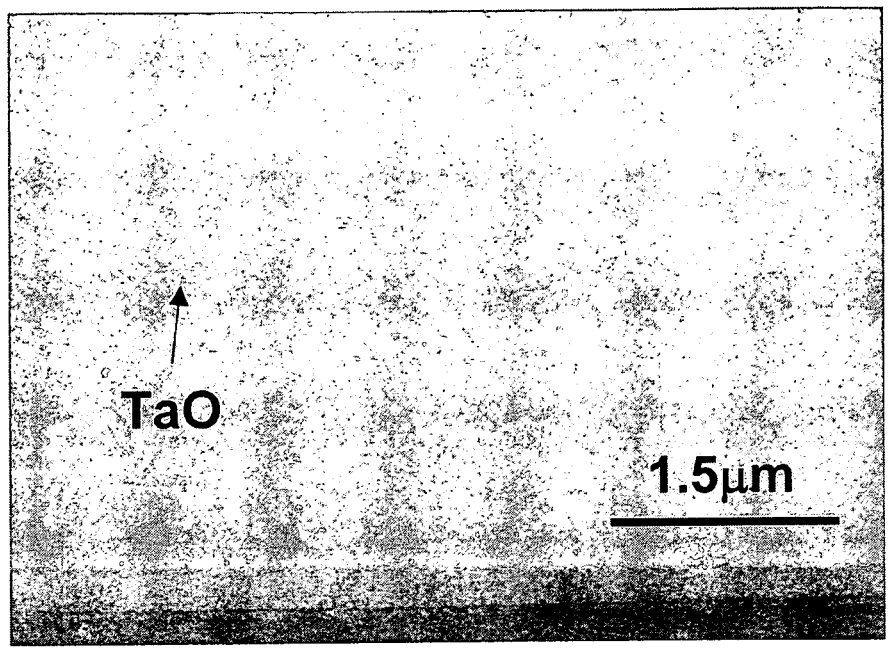
FIGS. 17(a) and (b) show scanning electron micrographs in samples shown in FIG. 16.
Figure 17:
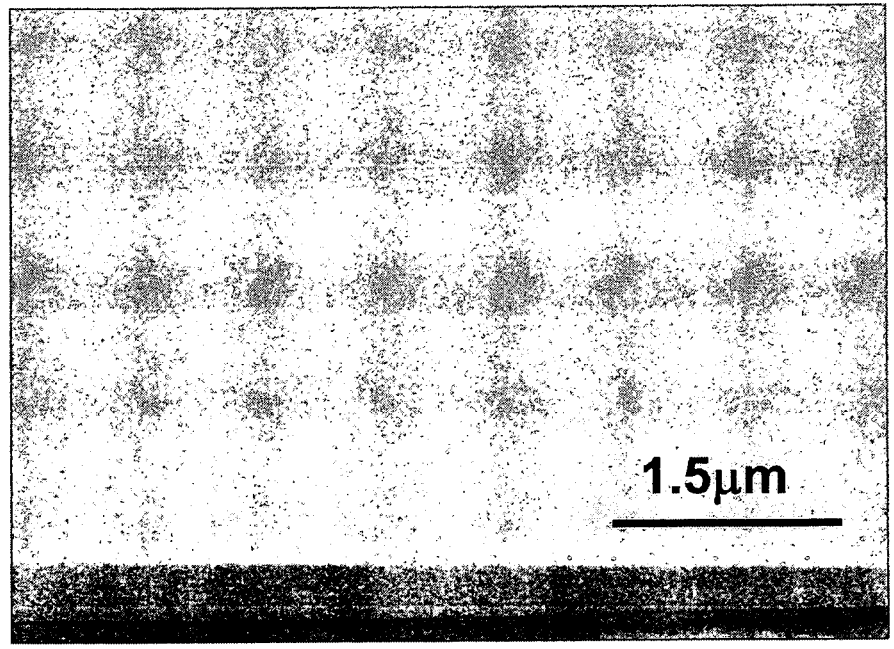

In addition, FIGS. 17(a) and (b) show scanning electron microscope (SEM) photographs of Ta barrier surfaces after, of the samples shown in FIG. 16, for a sample on whose surface a Ti film has been formed, the Ta on the surface has been removed by diluted hydrofluoric acid, and furthermore, for both samples, Cu has been removed by nitric acid. As shown in FIG. 17(a), in the sample which has received a heat treatment at 350° C. for 30 minutes without forming a Ti film on the Cu surface after a Cu film formation, a Ta surface at a part where Cu grain boundaries had, presumedly, existed has bulged, and oxidation of Ta at this part has been confirmed. In contrast thereto, as shown in FIG. 17(b), in a sample for which a Ti film has been formed on the Cu surface after a Cu film formation and which has received a heat treatment at 350° C. for 30 minutes, the Ta surface is flat and smooth and no Ta oxidation is recognized. These results correspond to the results of an SIMS analysis shown in FIG. 16.

It is considered that the Ta oxidation is due to oxygen on the Cu surface and in Cu which has been diffused by a heat treatment at 350° C. and has oxidized Ta. In the case where a Ti film has been formed on the Cu surface, it is considered that the Ti getters oxygen on the Cu surface and in Cu during the following annealing and thereby oxidation of the barrier Ta was suppressed. Accordingly, effects of the Ti film on the Cu surface includes an effect to suppress barrier Ta from oxidation by gettering oxygen in Cu.

(Modifications of the Invention)

For the wiring metal for a semiconductor device and manufacturing method therefor described in the above, the following modifications may be provided.

In the above-mentioned embodiments, it has been described that the lower-layer wiring and upper-layer wiring could be formed by an identical method, however, lower-layer wiring and upper-layer wiring may be formed by different methods by a combination of the above-mentioned respective embodiments.

As a constituent material of the insulating film 1, SiO$_2$ and the like and other insulating materials can be used. As the constituent material of the insulating film 1, it is preferable to use a materiel of a lower dielectric constant. The insulating film 1 is formed by a plasma CVD method or the like. Although the film thickness of the insulating film 1 is not particularly limited, the thickness of the insulating film 1a is on the order of 100 to 3000 nm, the thickness of the insulating film 1b is on the order of 100 to 1000 nm, the thickness of the insulating film 1c is on the order of 100 to 1000 nm, and the thickness of the insulating film 1d is on the order of 100 to 1000 nm.

As a constituent material of the stopper insulating film 2, insulating materials such as SiC, SiN, SiCN, and the like can be used. As the constituent material of the stopper insulating film 2, it is preferable to use a material of a lower dielectric constant. The stopper insulating film 2 is formed by a plasma CVD method or the like. Although the film thickness of the stopper insulating film 2 is not particularly limited, the thickness of the stopper insulating film 2a is on the order of 10 to 100 nm, and the thickness of the stopper insulating film 2b is on the order of 10 to 100 nm. In addition, although the stopper insulating film 2 is used as an etching stopper of concavities for wiring, however, if the concavities for wiring can be processed in an objective form, the stopper insulating film 2 is not necessarily used.

The wiring grooves are formed by lithography and etching (anisotropic etching) or the like. Although the width of the wiring grooves is not particularly limited, normally, these are provided on the order of a diameter of 50 to 20000 nm.

As a constituent material of the barrier metal 3, a substance selected from metals such as Ta, Ti, and W, nitrides of these metals, ternary or quaternary nitrides produced by adding Si or the like to these nitrides can be used. The barrier metal film 3 is formed by an ionization sputtering method, a CVD method, an Atomic Layer Deposition (ALD) method or the like. Although the film thickness of the barrier metal film 3 is not particularly limited, the barrier metal film 3a is on the order of 5 to 50 nm, and the barrier metal film 3b is on the order of 5 to 50 nm.

As a method for forming the metal wiring Cu 4, this can be formed, after forming a Cu thin film by an ionization sputtering method, a CVD method, a metal-organic chemical vapor deposition method (MO-CVD method) or the like, by an electrolytic plating method while using this Cu thin film as an electrode or by an MO-CVD method. In addition, it is also possible to directly bury Cu into wiring grooves by an MO-CVD method without forming a Cu thin film. The film thickness of the metal wiring Cu 4 is not particularly limited as long as this is formed to such an extent to fill up the wiring grooves and wiring holes.

A heat treatment for Cu crystal grain growth (Cu polycrystallization) is performed in a reducing atmosphere of nitrogen, hydrogen or the like. This heat treatment is performed at 400° C. or less, and preferably, at 300° C. or less. However, this heat treatment step may be omitted.

As a constituent material of the additional element layer 5, Ti, Zr, Hf, Cr, Co, Al, Sn, Mg, Ag and the like can be used. The additional element layer 5 is formed by sputtering or the like. Although the film thickness of the additional element layer 5 is not particularly limited, the additional element layer 5a is on the order of 5 to 100 nm, and the additional element layer 5b is on the order of 5 to 100 nm.

A heat treatment to diffuse the additional element into Cu 4 from the additional element layer 5 is performed in an atmosphere of nitrogen or the like. This heat treatment is performed under a temperature condition on the order of 300 to 500° C. for 10 minutes to 1 hour.

Removal of an excessive additional element layer 5 is performed by wet etching with hydrofluoric acid or by CMP. Removal of excessive Cu 4 and an excessive barrier metal film 3 is performed by CMP.

As a constituent material of the barrier insulating film 8, insulating materials having barrier properties against Cu such as SiCN, SiC, SiN and the like can be used. The barrier insulating film 8 is formed by a plasma CVD method or the like. Although the film thickness of the barrier insulating film 8 is not particularly limited, the barrier insulating film 8a is on the order of 20 to 100 nm, the barrier insulating film 8b is on the order of 20 to 100 nm.

Wiring holes are formed by lithography and anisotropic dry etching or the like. Although the width of the wiring holes is not particularly limited, normally, these are provided on the order of a diameter of 50 to 1000 nm.

As a constituent material of the cover insulating film 9, $SiO_2$ and the like and other insulating materials can be used. The cover insulating film 9 is formed by a plasma CVD method or the like. Although the film thickness of the cover insulating film 9 is not particularly limited, the cover insulating film 9 is on the order of 100 to 10000 nm.

In the above embodiments and example, descriptions have been given while raising, as an example, a semiconductor device for which metal wiring composed of a wiring metal containing polycrystal consisting primarily of Cu and an additional element other than Cu has been formed on a substrate on which a semiconductor element has been formed. In the present invention, wiring metals having the aforementioned structure and wiring metals manufactured by the aforementioned respective manufacturing methods are used as metallic materials for wiring for not only semiconductor devices but also other uses.

What is claimed is:

1. A copper alloy for wiring formed by a manufacturing method comprising the steps of:
    forming a polycrystalline Cu film;
    forming, on the polycrystalline Cu film, a layer made of an additional element to be added into the polycrystalline Cu film;
    diffusing the additional element from the additional element layer into the polycrystalline Cu film via crystal grain boundaries to form a polycrystalline copper alloy; and
    simultaneously therewith performing gettering of oxygen in the polycrystalline Cu film into the additional element layer, wherein
    the additional element is at least one element selected from a group consisting of Ti (titanium), Zr (zirconium), Hf (hafnium), Cr (chromium), Co (cobalt), Al (aluminum), Ni (nickel), and Mg (magnesium), and
    concentration of the additional element is, at grain boundaries of crystal grains composing the polycrystalline copper alloy and in vicinities of grain boundaries, higher than that of the inside of the crystal grains, a barrier metal film containing a barrier metal is formed to surround the polycrystalline copper alloy, and concentration of the additional element is, at the interface between the polycrystalline copper alloy and the barrier metal film and in vicinities of said interface, higher than that of the inside of the crystal grains, and
    the barrier metal in the barrier metal film has not been oxidized.

2. A copper alloy for wiring formed by a manufacturing method comprising the steps of:
    forming a polycrystalline Cu film;
    forming, on the polycrystalline Cu film, a layer made of an additional element to be added into the polycrystalline Cu film;

diffusing the additional element from the additional element layer into the polycrystalline Cu film via crystal grain boundaries to form a polycrystalline copper alloy; and simultaneously therewith performing gettering of oxygen in the polycrystalline Cu film into the additional element layer, wherein the additional element is at least one element selected from a group consisting of Ti (titanium), Zr (zirconium), Hf (hafnium), Cr (chromium), Co (cobalt), Al (aluminum), Sn (tin), Ni (nickel), and Mg (magnesium), and concentration of the additional element is, at grain boundaries of crystal grains composing the polycrystalline copper alloy and in vicinities of grain boundaries, higher than that of the inside of the crystal grains, and an oxide of the additional element is formed at said grain boundaries and/or in vicinities of said grain boundaries, and a barrier metal in a barrier metal film has not been oxidized.

3. A copper alloy for wiring formed by a manufacturing method comprising the steps of:

forming a polycrystalline Cu film;

forming, on the polycrystalline Cu film, a layer made of an additional element to be added into the polycrystalline Cu film;

diffusing the additional element from the additional element layer into the polycrystalline Cu film via crystal grain boundaries to form a polycrystalline copper alloy; and simultaneously therewith performing gettering of oxygen in the polycrystalline Cu film into the additional element layer, wherein the additional element is at least one element selected from a group consisting of Ti (titanium), Zr (zirconium), Hf (hafnium), Cr (chromium), Co (cobalt), Al (aluminum), Ni (nickel), and Mg (magnesium), and concentration of the additional element is, at grain boundaries of crystal grains composing the polycrystalline copper alloy and in vicinities of grain boundaries, higher than that of the inside of the crystal grains, and concentration of the additional element in the crystal grains is 0.1 atomic percent or less, and a barrier metal in a barrier metal film has not been oxidized.

4. The copper alloy for wiring as set forth in claim 3, wherein at the crystal grain boundaries and/or in the vicinities of grain boundaries, intermetallic compounds of Cu and at least one element selected from a group consisting of Ti, Zr, Hf, Cr, Co, Al, Ni, and Mg are formed.

5. The copper alloy for wiring as set forth in claim 3, wherein at the crystal grain boundaries and/or in the vicinities of grain boundaries, oxides of at least one element selected from a group consisting of Ti, Zr, Fit Cr, Co, Al, Ni, and Mgare formed.

6. A semiconductor device comprising a substrate on which a semiconductor element is formed, and a metal wiring composed of the copper alloy for wiring as set forth in any one of claims 1, 2, 3, 4 or 5.

7. The copper alloy for wiring as set forth in any one of claims 2, 3, 4 or 5, wherein concentration of the additional element at the grain boundaries and in the vicinities of grain boundaries is on the order of 2 to 1000 times the additional element concentration at the inside of the crystal grains.

8. The copper alloy for wiring as set forth in claim 3, wherein concentration of the additional element at the grain boundaries and in the vicinities of grain boundaries is on the order of 10 to 100 times the additional element concentration at the inside of the crystal grains.

* * * * *

UNITED STATES PATENT AND TRADEMARK OFFICE
CERTIFICATE OF CORRECTION

PATENT NO. : 7,545,040 B2
APPLICATION NO. : 10/538306
DATED : June 9, 2009
INVENTOR(S) : Makoto Ueki It is certified that error appears in the above-identified patent and that said Letters Patent is hereby corrected as shown below:

Column 22, line 18, delete "Fit", insert -- Hf --

Signed and Sealed this

Ninth Day of March, 2010

David J. Kappos
*Director of the United States Patent and Trademark Office*